United States Patent
Satou

(10) Patent No.: US 9,177,092 B2
(45) Date of Patent: Nov. 3, 2015

(54) METHOD FOR ARRANGING AND WIRING RECONFIGURABLE SEMICONDUCTOR DEVICE, PROGRAM THEREFOR, AND ARRANGING AND WIRING APPARATUS

(71) Applicant: TAIYO YUDEN CO., LTD., Tokyo (JP)

(72) Inventor: Masayuki Satou, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/390,729

(22) PCT Filed: Feb. 14, 2013

(86) PCT No.: PCT/JP2013/053453
§ 371 (c)(1),
(2) Date: Oct. 3, 2014

(87) PCT Pub. No.: WO2013/153852
PCT Pub. Date: Oct. 17, 2013

(65) Prior Publication Data
US 2015/0095860 A1 Apr. 2, 2015

(30) Foreign Application Priority Data
Apr. 9, 2012 (JP) ................................. 2012-088864

(51) Int. Cl.
*G06F 9/45* (2006.01)
*G06F 17/50* (2006.01)

(52) U.S. Cl.
CPC ........ *G06F 17/5054* (2013.01); *G06F 17/5077* (2013.01)

(58) Field of Classification Search
CPC .......................... G06F 17/5054; G06F 17/5077
See application file for complete search history.

(56) References Cited

U.S. PATENT DOCUMENTS

| | | | |
|---|---|---|---|
| 6,215,689 B1* | 4/2001 | Chhor et al. ..................... 365/63 |
| 6,331,788 B1* | 12/2001 | Lyke ................................ 326/39 |
| 6,496,971 B1* | 12/2002 | Lesea et al. ..................... 716/128 |
| 7,784,005 B1* | 8/2010 | Ng .................................. 716/128 |
| 2004/0080999 A1* | 4/2004 | Madurawe ..................... 365/200 |

(Continued)

FOREIGN PATENT DOCUMENTS

| | | | |
|---|---|---|---|
| JP | H8-87537 A | 4/1996 |
| JP | 2009-194676 A | 8/2009 |

(Continued)

OTHER PUBLICATIONS

"Laboratory Exercise 3", by Altera , @2011.*

(Continued)

*Primary Examiner* — Nha Nguyen
(74) *Attorney, Agent, or Firm* — Chen Yoshimura LLP

(57) ABSTRACT

An arrangement and wiring method of a reconfigurable semiconductor device, including: generating a net list based on a circuit description in which a circuit configuration is described; extracting a sequential circuit data set which is to be scanned from the net list; generating a first truth value table data set so as to write into a first set among plurality of memory cell units from the sequential circuit data set which is to be scanned; and generating a second truth value table data set so as to write into a second set among the plurality of memory cell units from a combination logic circuit data set of the net list.

5 Claims, 25 Drawing Sheets

(56) References Cited

U.S. PATENT DOCUMENTS

2009/0154282 A1* 6/2009 Satoh ............... 365/230.03
2009/0290444 A1 11/2009 Satoh
2012/0007635 A1* 1/2012 Hironaka et al. ............... 326/46
2013/0100750 A1 4/2013 Ishiguro et al.

FOREIGN PATENT DOCUMENTS

| JP | 2010-239325 A | 10/2010 |
| WO | 2007/060763 A1 | 5/2007 |
| WO | 2011/162116 A1 | 12/2011 |

OTHER PUBLICATIONS

Written Opinion (PCT/ISA/237) issued in PCT/JP2013/053453 mailed in May 2013.
International Search Report (ISR) issued in PCT/JP2013/053453 mailed in May 2013.

* cited by examiner

FIG. 18

| A0 | A1 | A2 | A3 | D0 | D1 | D2 | D3 |
|---|---|---|---|---|---|---|---|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

FIG. 20

| A0 | A1 | A2 | A3 | D0 | D1 | D2 | D3 |
|----|----|----|----|----|----|----|----|
| 0  | 0  | 0  | 0  | 0  | 0  | 0  | 0  |
| 1  | 0  | 0  | 0  | 0  | 1  | 0  | 0  |
| 0  | 1  | 0  | 0  | 0  | 0  | 1  | 0  |
| 1  | 1  | 0  | 0  | 0  | 1  | 1  | 0  |
| 0  | 0  | 1  | 0  | 0  | 0  | 0  | 1  |
| 1  | 0  | 1  | 0  | 0  | 1  | 0  | 1  |
| 0  | 1  | 1  | 0  | 0  | 0  | 1  | 1  |
| 1  | 1  | 1  | 0  | 0  | 1  | 1  | 1  |
| 0  | 0  | 0  | 1  | 1  | 0  | 0  | 0  |
| 1  | 0  | 0  | 1  | 1  | 1  | 0  | 0  |
| 0  | 1  | 0  | 1  | 1  | 0  | 1  | 0  |
| 1  | 1  | 0  | 1  | 1  | 1  | 1  | 0  |
| 0  | 0  | 1  | 1  | 1  | 0  | 0  | 1  |
| 1  | 0  | 1  | 1  | 1  | 1  | 0  | 1  |
| 0  | 1  | 1  | 1  | 1  | 0  | 1  | 1  |
| 1  | 1  | 1  | 1  | 1  | 1  | 1  | 1  |

FIG.23

| A0 | A1 | A2 | A3 | D0 | D1 | D2 | D3 |
|---|---|---|---|---|---|---|---|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |

US 9,177,092 B2

METHOD FOR ARRANGING AND WIRING RECONFIGURABLE SEMICONDUCTOR DEVICE, PROGRAM THEREFOR, AND ARRANGING AND WIRING APPARATUS

CROSS-REFERENCE TO RELATED APPLICATION

This application is a 371 application of an international PCT application serial no. PCT/JP2013/053453, filed on Feb. 14, 2013, which claims the priority benefit of the Japanese Patent Application No. 2012-088864, filed on Apr. 9, 2012, the entire contents of which are incorporated herein by reference.

TECHNICAL FIELD

The present invention relates to a method for arranging and wiring a reconfigurable semiconductor device, a program therefor, and a arranging and wiring apparatus.

BACKGROUND ART

A PLD (Programmable Logic Device) such as an FPGA (Field-Programmable Gate Array), which is capable of switching a circuit configuration, is widely used. The applicant or the inventor has been developing an "MPLD (Memory-based Programmable Logic Device)" (Registered trademark), which can realize circuit configuration by a memory cell unit. An MPLD is described, for example, in the following Patent Literature 1. The MPLD connects memory arrays each of which is referred to as an MLUT (Multi Look-Up-Table) with each other. The MLUT stores truth value data and configures the wiring element and the logic element. The MPLD places such MLUTs in arrays and connects the same with each other, whereby realizes the function approximately the same as that of the FPGA.

Further, the MPLD is a device which offers flexibility to the logic area and the wiring area by using the MLUTs as both the logic element and the wiring element. Such feature is different from an FPGA which has a dedicated switch circuit for connecting the memory units with each other.

The optimal arrangement and wiring methods for the FPGA are already considered (Patent Literature 2). In the case of arranging and wiring MPLD, the MLUTs operate as the logic element and/or the connection element, whereby the writing in of the truth value table data to the MLUTs means arrangement of the logic operation and/or the wiring between the MLUTs. Accordingly, the creation of the truth value table data for the writing in to MLUTs corresponds to "arrangement and wiring" of MPLD, although the optimal arrangement and wiring method for the MPLD has not been disclosed.

PRIOR ART DOCUMENT(S)

Patent Literature(s)

Patent literature 1: Japanese Patent Application Laid-open Publication No. 2010-239325
Patent literature 2: Japanese Patent Application Laid-open Publication No. H8-87537

SUMMARY OF THE INVENTION

Problems to be Solved by the Invention

The MPLD realizes the wiring element and the logic element by the same MLUTs. Accordingly, the arrangement of the logic cells may be organized when configuring a circuit, whereby the number of MLUTs to be used as the wiring element can be reduced. That is to say, the number of MLUTs to be used as the logic element can be increased, whereby the desired function can be realized by an MPLD with a smaller scale. However, MPLD realizes the wiring element and the logic element by the MLUTs which are the same memory cell units, and thus the algorithm of the arranging and wiring tools for the FPGA in which the logic and the wiring are realized by different circuit units cannot be used. Under such circumstances, the arranging and wiring method for the MPLD is required.

The arranging and wiring method according to the present embodiment has an object of reducing the number of the memory cell units to be used for wiring logic and enhancing the arranging and wiring efficiency for a reconfigurable semiconductor device configured by the memory cell units.

Means to Solve the Problems

Embodiments to solve the above mentioned problems are realized as an arrangement and wiring method of a reconfigurable semiconductor device shown in the following item sets.

1. An arrangement and wiring method of a reconfigurable semiconductor device, characterized by including:
generating a net list based on a circuit description in which a circuit configuration is described;
extracting a sequential circuit data set which is to be scanned from the net list;
generating a first truth value table data set so as to write into a first set among plurality of memory cell units from the sequential circuit data set which is to be scanned; and
generating a second truth value table data set so as to write into a second set among the plurality of memory cell units from a combination logic circuit data set of the net list;
wherein the reconfigurable device includes the plurality of memory cell units configuring arrays and are connected to each other, and the memory cell units operate as a logic element when truth value table data is written in configured so as to output a logic calculation of an input value specified by a plurality of addresses to a data line, and/or operate as a connection element when truth value table data is written in configured so as to output an input value specified by a certain address to a data line connected to an address of another memory cell unit.

2. The arrangement and wiring method according to item 1, wherein
a memory cell unit to which the first truth value table data set is allotted is simulated with an execution in synchronization with a clock, and/or the plurality of the second truth value table data sets are simulated with an execution in non-synchronization with the clock, and whether the semiconductor device realizes a certain operation speed is evaluated.

3. The arrangement and wiring method according to item 1 or 2, wherein
the semiconductor device includes for each memory cell unit an address decoder which decodes an address input from N (N being an integer of 2 or more) number of address lines and outputs a word selection signal to a word line,
the memory cell unit is connected to the word line and the data line, stores respective piece of data configuring the truth value table, and includes a plurality of storage elements which input and output the data to and from the data line by the word selection signal input from the word line, and the N number of address lines of the memory cell unit are respectively connected to the data line of N number of memory cell units other than the memory cell unit.

4. An arrangement and wiring apparatus which performs arrangement and wiring of a reconfigurable semiconductor device, characterized by including a processor, wherein the processor:

generates a net list based on a circuit description in which a circuit configuration is described;

extracts a sequential circuit data set which is to be scanned from the net list;

generates a first truth value table data set so as to write into a first set among plurality of memory cell units from the sequential circuit data set which is to be scanned; and generates a second truth value table data set so as to write into a second set among the plurality of memory cell units from a combination logic circuit data set of the net list; and wherein the reconfigurable semiconductor device includes the plurality of memory cell units configuring arrays, and the memory cell units operate as a logic element when truth value table data is written in configured so as to output a logic calculation of an input value specified by a plurality of addresses to a data line, and/or operate as a connection element when truth value table data is written in configured so as to output an input value specified by a certain address to a data line connected to an address of another memory cell unit.

5. The arrangement and wiring apparatus according to item 4, wherein the processor is configured so as to simulate an execution in synchronization with a clock for a memory cell unit to which the first truth value table data set is allotted, and/or simulate an execution in non-synchronization with the clock for the plurality of the second truth value table data sets, and evaluate whether the semiconductor device realizes a certain operation speed.

6. A program to arrange and wire a reconfigurable semiconductor device, characterized by making a processor execute processing of:

generating a net list based on a circuit description in which a circuit configuration is described;

extracting a sequential circuit data set which is to be scanned from the net list;

generating a first truth value table data set so as to write into a first set among plurality of memory cell units from the sequential circuit data set which is to be scanned; and generating a second truth value table data set so as to write into a second set among the plurality of memory cell units from a combination logic circuit data set of the net list; and wherein the reconfigurable semiconductor device includes the plurality of memory cell units configuring arrays, and the memory cell units operate as a logic element when truth value table data is written in configured so as to output a logic calculation of an input value specified by a plurality of addresses to a data line, and/or operate as a connection element when truth value table data is written in configured so as to output an input value specified by a certain address to a data line connected to an address of another memory cell unit.

7. The program according to item 6 which makes the processor execute processing of simulating an execution in synchronization with a clock for a memory cell unit to which the first truth value table data set is allotted, and/or simulating an execution in non-synchronization with the clock for the plurality of the second truth value table data sets, and evaluating whether the semiconductor device realizes a certain operation speed.

8. The program according to item 6 or 7, wherein the semiconductor device includes for each memory cell unit an address decoder which decodes an address input from N (N being an integer of 2 or more) number of address lines and outputs a word selection signal to a word line, the memory cell unit is connected to the word line and the data line, stores respective piece of data configuring the truth value table, and includes a plurality of storage elements which input and output the data to and from the data line by the word selection signal input from the word line, and the N number of address lines of the memory cell unit are respectively connected to the data line of N number of memory cell units other than the memory cell unit.

9. A storage medium which stores the programs itemed in any one of items 4-6.

Effect of the Invention

The arranging and wiring method according to the present embodiment reduces the number of the memory cell units to be used for wiring logic and enhances the arranging and wiring efficiency for a reconfigurable semiconductor device configured by the memory cell units.

BRIEF DESCRIPTION OF THE DRAWINGS

FIG. 18 is a diagram showing a truth value table of the logic circuit shown in FIG. 17;

FIG. 20 is a diagram showing a truth value table of the connection element shown in FIG. 19;

FIG. 23 is a diagram showing a truth value table of the logic element and the connection element shown in FIG. 22.

MODES FOR CARRYING OUT THE INVENTION

Hereinbelow, examples of [1] a reconfigurable semiconductor device, [2] an arranging and wiring method, [3] a truth value table which operates the MLUTs as a logic element and/or a connection element, are described in this order with reference to the drawings.

[1] A Reconfigurable Semiconductor Device

Hereinbelow, a reconfigurable semiconductor device including an MLUT which is capable of switching to and from synchronization and non-synchronization is described by using two examples.

Figure 1:
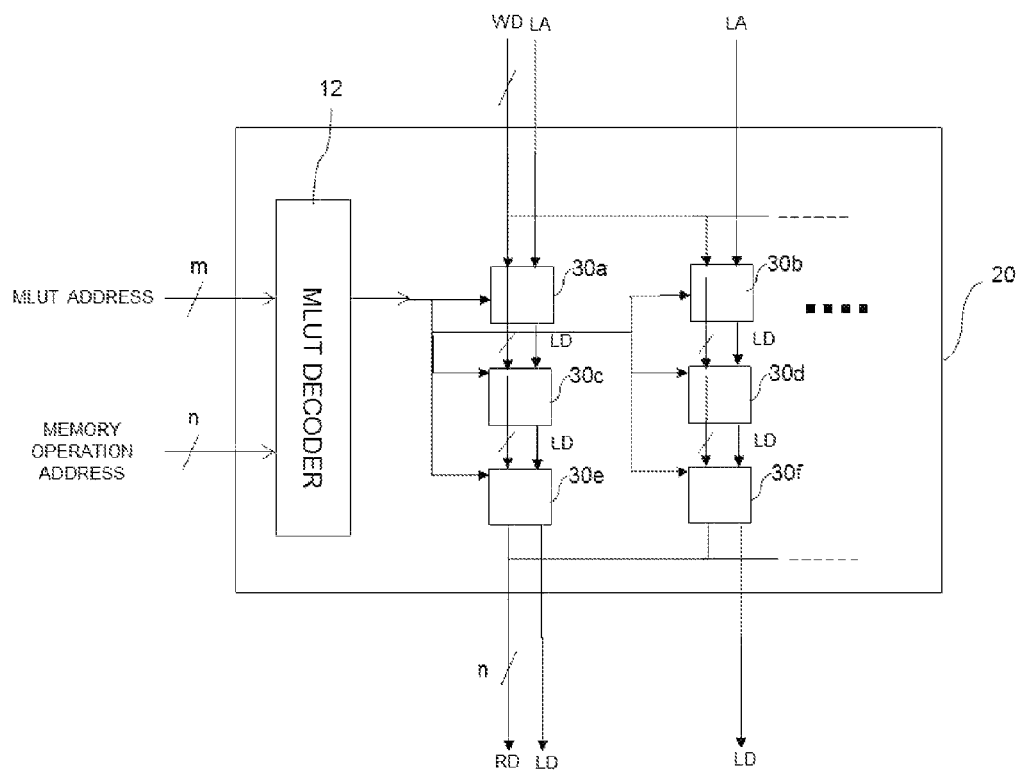
FIG. 1 is a first example of an MLUT capable of switching to and from synchronization and non-synchronization.

[1.1] A First Example of an MLUT which is Capable of Switching to and from Synchronization and Non-Synchronization FIG. 1 is a first example of an MLUT capable of switching to and from synchronization and non-synchronization. An MPLD 20 as a reconfigurable semiconductor device connects memory circuits mutually which realize both the wiring element and the logic element, and are referred to as MLUTs, whereby configures logic. The MPLD 20 has a configuration in which MLUTs are paved in arrays and MLUTs are mutually connected to each other by using a pair of an address line LA and a data line LD, as shown in FIG. 1. The MPLD 20 includes a plurality of MLUT 30 configured by memory cell units, and an MLUT decoder 12 which decodes an address to specify the MLUT and specifies the MLUT which is to be the operation target. The MPLD 20 instructs the storage elements of the MLUT 30 to store data configuring the truth value table, whereby performs logic operation to operate as the logic element, or the connection element, or the logic element and the connection element.

The MPLD 20 further performs memory operation. The memory operation is referred to as the write-in WD of data into the memory cell units included in the MLUT 30, and the read-out RD of the data. The writing in of data to the MLUT 30 also rewrites the truth value table data, and thus the memory operation generates reconfiguration of the truth value table data.

Figure 2:
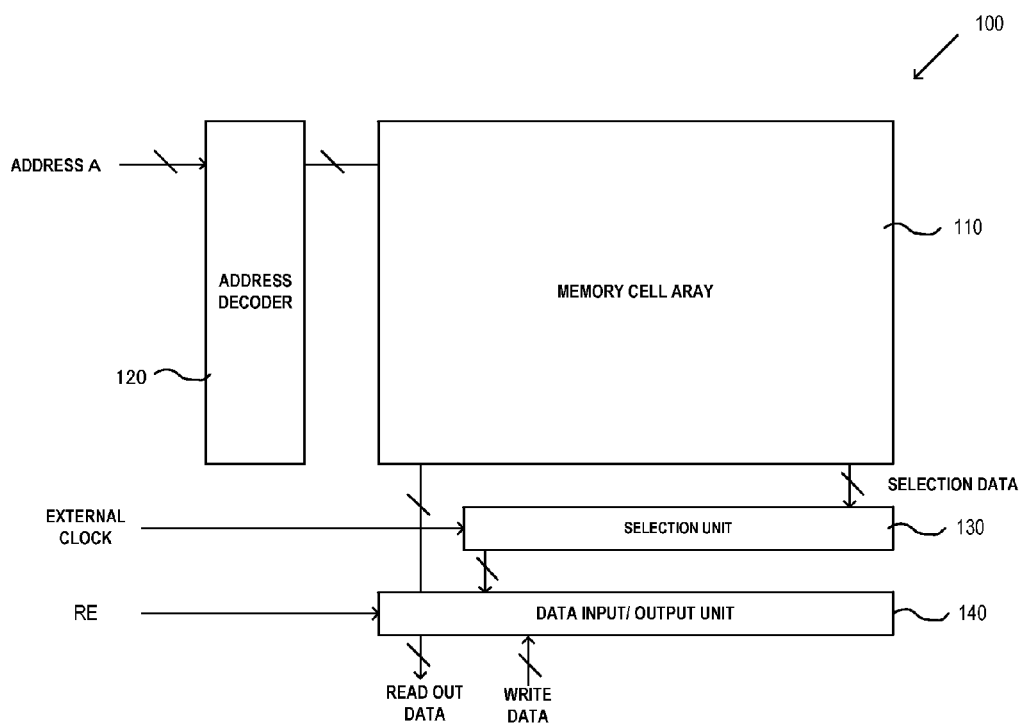
FIG. 2 is a diagram showing a first example of an MLUT.

FIG. 2 is a diagram showing the first example of the MLUT. The MLUT 30 includes: a memory cell array 110 having memory cells each of which storing data; an address decoder 120; a selection unit 130 which selects an external clock supplied from outside; and a data input/output unit 140 which reads out or writes in data to the memory cell array 110 in accordance with whether or not the external clock is selected.

Figure 3:
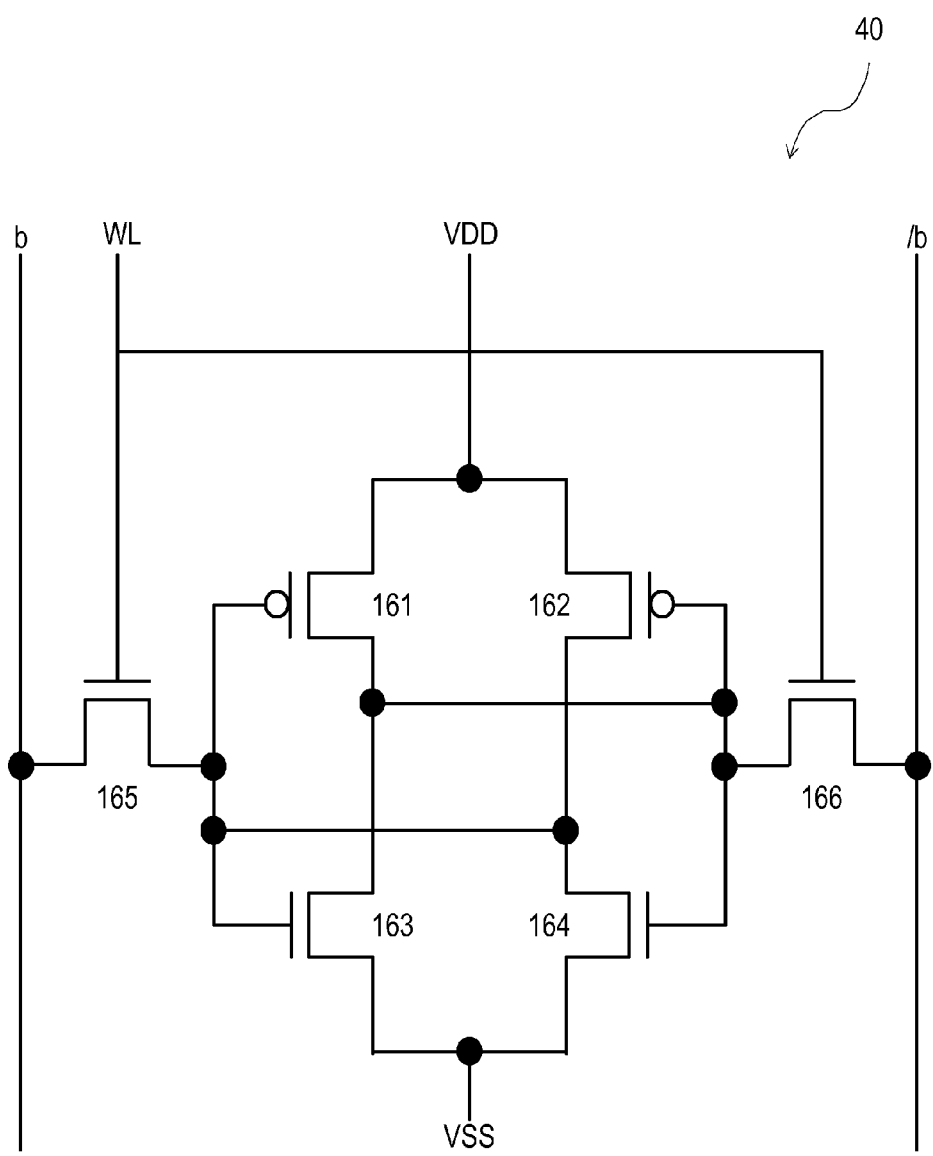
FIG. 3 is a detailed example of a storage element.

The memory cell array includes n×2m number of storage elements, and the n×2n number of storage elements are placed at the connection portion between the 2 to the nth power number of word lines and n number of bit lines. Note that the number of bit lines may be increased to more than n if necessary. FIG. 3 is a detailed example of the storage element. The storage element 40 shown in FIG. 3 includes pMOS transistors 161, 162, and nMOS transistors 163 164, 165, 166. The source of the pMOS transistor 161 and the source of the pMOS transistor 162 are connected to VDD (power voltage terminal). The drain of the nMOS transistor 163 and the drain of the nMOS transistor 164 are connected to VSS (ground voltage terminal).

The drain of the nMOS transistor 165 is connected to a bit line b. The gate of the nMOS transistor 165 is connected to a word line WL. The drain of the nMOS transistor 166 is connected to a bit line /b. The gate of the nMOS transistor 166 is connected to a word line WL.

By the above configuration, in the writing in operation, the storage element 40 retains, by the signal level [H (High)] of the word line WL, the signal level transmitted by the bit line b and the bit line /b in the pMOS transistors 161, 162, and nMOS transistors 163, 164. In the reading out operation, the storage element 40 transmits, by the signal level [H] of the word line WL, the signal level retained in the pMOS transistors 161, 162 and the nMOS transistors 163, 164 to the bit line b and the bit line /b.

Figure 4:
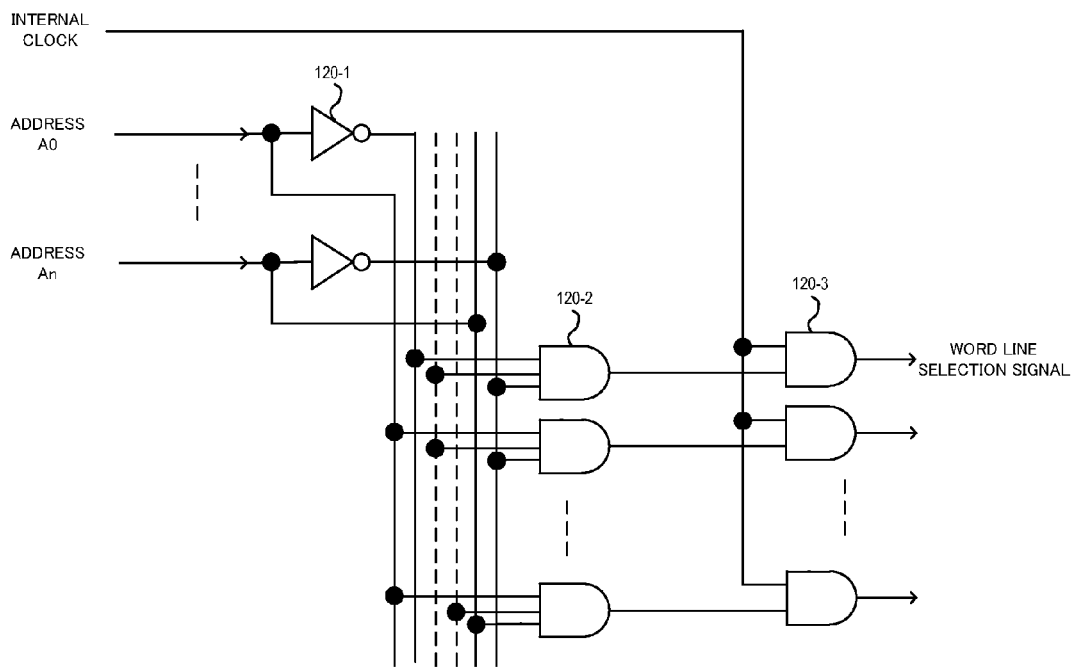
FIG. 4 is a detailed example of an address decoder.

FIG. 4 is a diagram showing a detailed example of an address decoder. The address decoder 120 shown in FIG. 4 includes, an inverter circuit 120-1, an AND circuit 120-2, and an AND circuit 120-3. There are n number of inverter circuits 120-1 for each n number of address signal lines. There are 2 to the nth power number of AND circuits 120-2 and 120-3, respectively.

The inverter circuit 120-1 inverts the logic of the address signal received from the n number of address signal lines, and outputs the inverted address signal to the AND circuit 120-2. The AND circuit 120-2 receives the address signal and the inverted address signal as an input signal, and when all of the signal levels of the input values are [H], outputs the output of the signal level [H] by the AND calculation to the second AND circuit. The AND circuit 12-3 receives the output of the AND circuit 120-2 and an internal clock (which is to be described later) as an input signal, and when all of the signal levels of the input values are [H], outputs the output of the signal level [H] by the AND calculation.

The word line selection signal has a signal level [H], and the word line non-selection signal has a signal level [L (Low)]. Accordingly, the address decoder 120 is configured so that the word line selection signal of signal level [H] is output to one word line among 2 to the nth power number of word lines.

Note that the example of FIG. 4 shows the one using an internal clock, although the decoder may be configured so as not to synchronize with the internal clock. In such case, the AND circuit 120-3 is not necessary, and the output of the AND circuit 120-2 is connected to the word line of the memory cell.

Referring to FIG. 2, the address decoder 120 decodes the address signal received from the n number of address signal lines, and outputs the word line selection signal which is the decode signal to the 2 to the nth power number of word lines WL.

The selection unit 130 is a selection circuit which transmits an external clock supplied from outside to the data input/output unit 140 based on the selection data supplied from outside. The selection unit 130 is configured by a plurality of selection circuits each of which is provided for each data output line. The selection circuit retains each piece of selection data supplied from outside. The selection data may be supplied from the memory cell array 110. In such case, each selection circuit is respectively connected to a specific memory cell (a memory cell for selection data) in the memory cell array 110, and when the signal level of the memory cell for the selection data is [H], the signal level of the selection data is also [H], and when the signal level of the memory cell for the selection data is [L], the signal level of the selection data is also [L]. When the signal level of the selection data is [L], the selection circuit transmits the external clock to the data input/output unit 140, and reading out data Q corresponding to such selection circuit is read out in synchronization with the external clock. When the signal level of the selection data is [H], the selection circuit does not transmit the external clock to the data input/output unit 140, and the reading out data Q corresponding to such selection circuit is read out without synchronization with the external clock.

When the data input/output unit 140 receives an edge timing of write-enable (WE) and writing in data from outside, the data input/output unit 140 transmits the signal level of such writing in data to the n number of bit lines b and /b, and writes in the writing in data to the memory cell. Further, the data input/output unit 140 outputs the signal level of the n number of bit lines b and /b to the outside, whereby outputs the reading out data.

Figure 5:
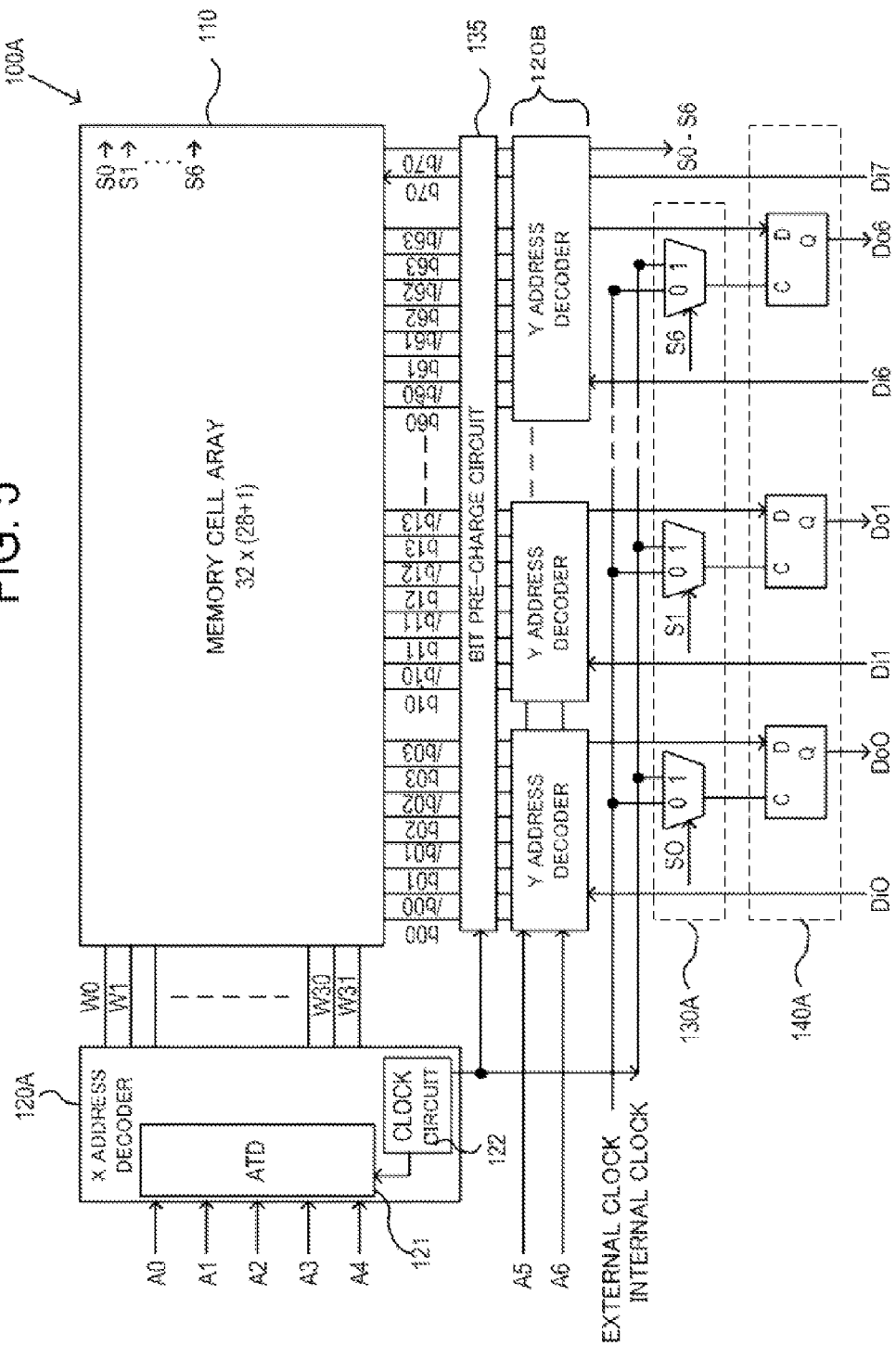
FIG. 5 is a diagram showing a detailed example of the MLUT.

FIG. 5 is a diagram showing a detailed example of an MLUT. The semiconductor memory device 100A shown in FIG. 4 includes, the memory cell 110, the address decoders 120A, 120B, a selection unit 130A, a bit pre-charge circuit 135, and a data input/output unit 140A.

In the example shown in FIG. 5, the memory cell unit 110 is configured as a grid in which X line is formed by 2 to the fifth power number of word lines, and Y line is formed by (2 to the twice power number times 7) number of bit lines and one bit line respectively provided for the reading out and writing in, vertically and horizontally. The memory cells are disposed at the intersections of the word lines and the bit lines. Accordingly, the memory cell unit 110 has (2 to the seventh power number multiplied by (7+1)) number of memory cells, among which 7 memory cells are the ones for the selection data as described above.

The address decoder 120 described with reference to FIG. 2 is configured by the X address decoder 120A for the X line and the Y address decoder 120B for the Y line in FIG. 5. The X address decoder 120A and the Y address decoder 120B are connected to the address signal lines A0-A4 and the address signal lines A5-A6, respectively. When the number of address signal lines is increased, as shown in FIG. 5, the decoders may be divided into those in the X lines and in the Y lines, whereby the memory cell shape can be extended in the X axis direction.

The memory cell for selection data retains selection data, and makes the signal of selection data the control signal of the selection circuit as S0, S1, . . . , S6.

The X address decoder 120A includes an ATD (Address Transition Detect) circuit 121 as the address transition detection unit. The ATD circuit is provided at the address input terminal, and is a circuit which detects the transition of the address input signal applied to the address input terminal and outputs the changed address signal. The detailed example of the ATD circuit is described later with reference to FIGS. 6 and 7.

The ATD circuit outputs the changed address signal to the X address decoder 120A only when the ATD circuit detects the transition of the address signal. Accordingly, the X address decoder 120A outputs the word selection signal only when the address signal changes, and does not output the word selection signal when the address signal does not change. By such configuration, the word line selection signal is not output when there is no address transition, whereby the error in the writing in operation by disturbance noise can be prevented. Further, the X address decoder 120A reduces the number of address lines which activate the word lines from that of the address decoder 120 shown in FIG. 2, whereby the possibility of the noise mixing into the memory cell via the word lines can be reduced when the address variation occurs.

Further, the X address decoder 120A includes a clock circuit 122 which generates an internal clock. As described later, the internal clock is used also for the flip-flop of the data input/output unit 140 and the synchronization signal of the ATD circuit 121. In the address decoder, the output variation of the word selection signal may be suppressed in synchronization with this internal clock. On the other hand, by making the internal clock cycle shorter than the external clock cycle, the high-speed of the non-synchronization SRAM is also compatible.

The internal clock may have a cycle different from that of the external cycle. In order to obtain high speed of a non-synchronization SRAM which is accessible without synchronization with the external clock as the non-synchronization SRAM, the internal clock may preferably have shorter cycle than the external clock.

Note that an example in which the ATD circuit 121 and the clock circuit 122 are provided in the X address decoder 120A is described in the above description, although the ATD circuit 121 and the clock circuit 122 may be provided separately from the X address decoder 120A. However, in order to detect the address transition, the ATD circuit 121 is required to be provided in the upper stage of the X address decoder 120A.

The Y address decoder 120B is configured by a plurality of selection circuits, and a plurality of such may be provided for every seven data lines. In such case, the respective selection circuit selects one bit pair b, /b as the data lines for output or input in accordance with the address singles A5, A6, from four bit pairs.

The bit line pre-charge circuit 135 pre-charges both the bit line b and the bit line /b to [1].

Figure 6:
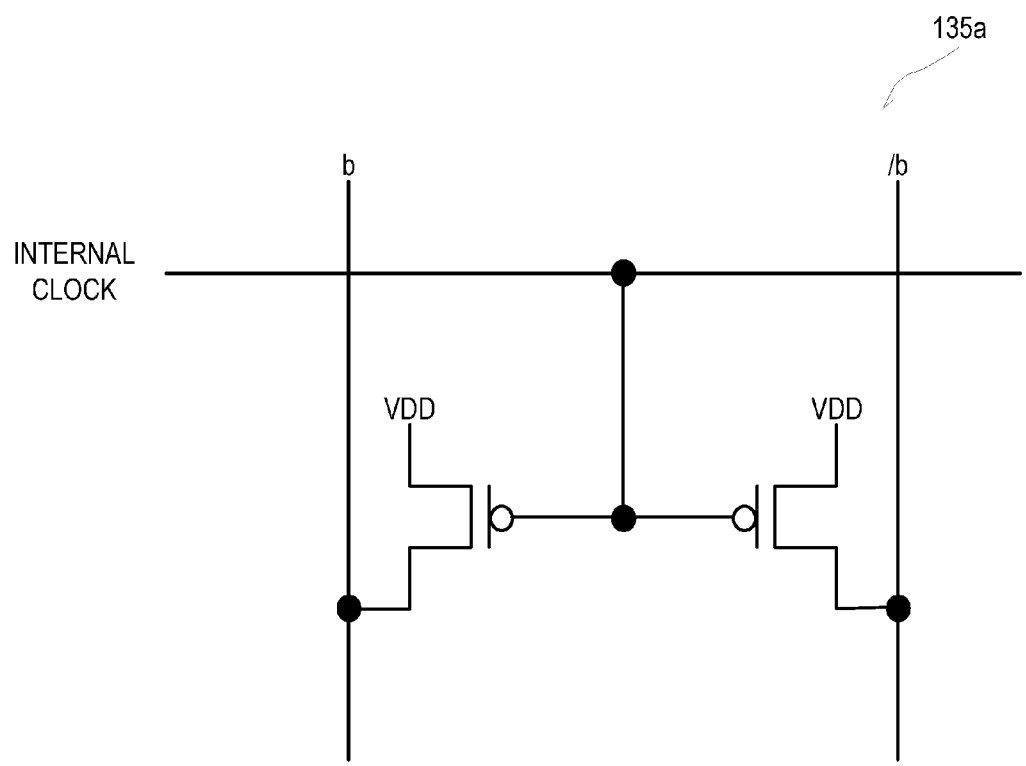
FIG. 6 is a diagram showing a detailed example of a pre-charge circuit.

FIG. 6 shows a detailed example of a bit line pre-charge circuit for a 1 bit line pair. The bit line pre-charge circuit 135a for 1 bit line pair includes two PMOSes, and the input of the bit line pre-charge circuit 135a is connected to the memory cell via the bit line b and the bit line /b. Further, the output of the bit line pre-charge circuit 135a is connected to the Y address decoder via the bit line b and the bit line /b. Still further, the bit line pre-charge circuit 135a pre-charges the signal level of the bit line pair b, /b to [H] in accordance with the internal clock. The bit line pre-charge circuit 135a for 1 bit line pair configured in this manner is provided for each bit line pair b, /b in the memory cell array 110.

When the clock is ON and the signal level is [H], the PMOS is turned OFF, the connection with the VDD is disconnected, and the bit line outputs the level by the information of the memory cell. When the signal level of the clock reaches [L], the PMOS turns ON, and the bit line is raised to the potential of VDD. In this manner, the bit line is connected to the memory cell only when the clock is ON, whereby the error in the writing in operation by the disturbance noise to the memory cell is prevented.

Referring back to FIG. 5, the selection unit 130A is configured by a plurality of selection circuits respectively provided for each data output line in the same manner as the selection unit 130 shown in FIG. 2. The selection circuit respectively retains selection data. The selection unit 130A is different from the selection unit 130 in that when the signal level of the selection data is [H], the selection circuit does not transmit the external clock to the data input/output unit 140, and transmits the internal clock to the data input/output unit 140. 1 bit line is added to the memory cell array 110, which is referred to as D7. The internal signal of the memory cell of the first address of D7 is S0, and the internal signal of the memory cell of the second address is S1. The signals to the internal signal S6 of the memory cell of the seventh address are selection signals of the internal clock and the external clock of the output latch clock.

The selection data can be retained in 1 bit, whereby the memory cell array 110 can be made smaller in size. Further, the existing memory cell may be used to store the selection data without newly providing a memory cell for storing selection data.

Note that a register to receive external data is to be necessary in order to directly write in data in the selection data from outside. Further, the outside is required with a writing in control for register. When the selection data can be written into the memory cell, the selection circuit can be controlled from outside without requiring new writing in control.

The external clock is input by a certain cycle, and the output does not change even when the address changes, although the non-synchronization operates in accordance with the internal clock when the address changes. In this manner, when the internal clock has shorter cycle than the external clock, the data access is possible with higher instantaneousness. Accordingly, in a case where higher speed is required when not being synchronized with the external clock, in the same manner as the non-synchronization SRAM, the internal clock is required to have shorter cycle than the external clock.

The data input/output unit 140 includes a plurality of flip-flops (F/F) (D-type flip-flop in the example shown in FIG. 4) provided for each output data line. The D input value at the rising edge of the C (CLOCK) terminal is retained as the Q output. That is to say, the output is varied only at the time of the clock, and information is retained at the rest of the time. In this manner, the bit line can be in the [H] state, and the margin can be secured when the device is lowered with voltage.

In the above mentioned example, there are 32 word lines, and the signal level is subjected to little degradation, and thus a sense amplifier is not shown. However, when the word lines are increased by the increase of the addresses and the memory cells, a sense amplifier, a light amplifier, and the like, may be provided in between the bit pre-charge circuit 135 and the Y address decoder 120B.

Further, the memory cell shown in FIG. 3 has a single-port. However, in the case of using a high-speed type memory cell which performs reading out and writing in simultaneously, the memory cell may have multi-ports.

As described above, when there is no address transition, the word line selection signal is not output, whereby the semi-conductor memory device 100A is capable of preventing error in writing in operation by the disturbance noise, as well as performing switching to and from the external clock and the internal clock for each data line.

Figure 7A:
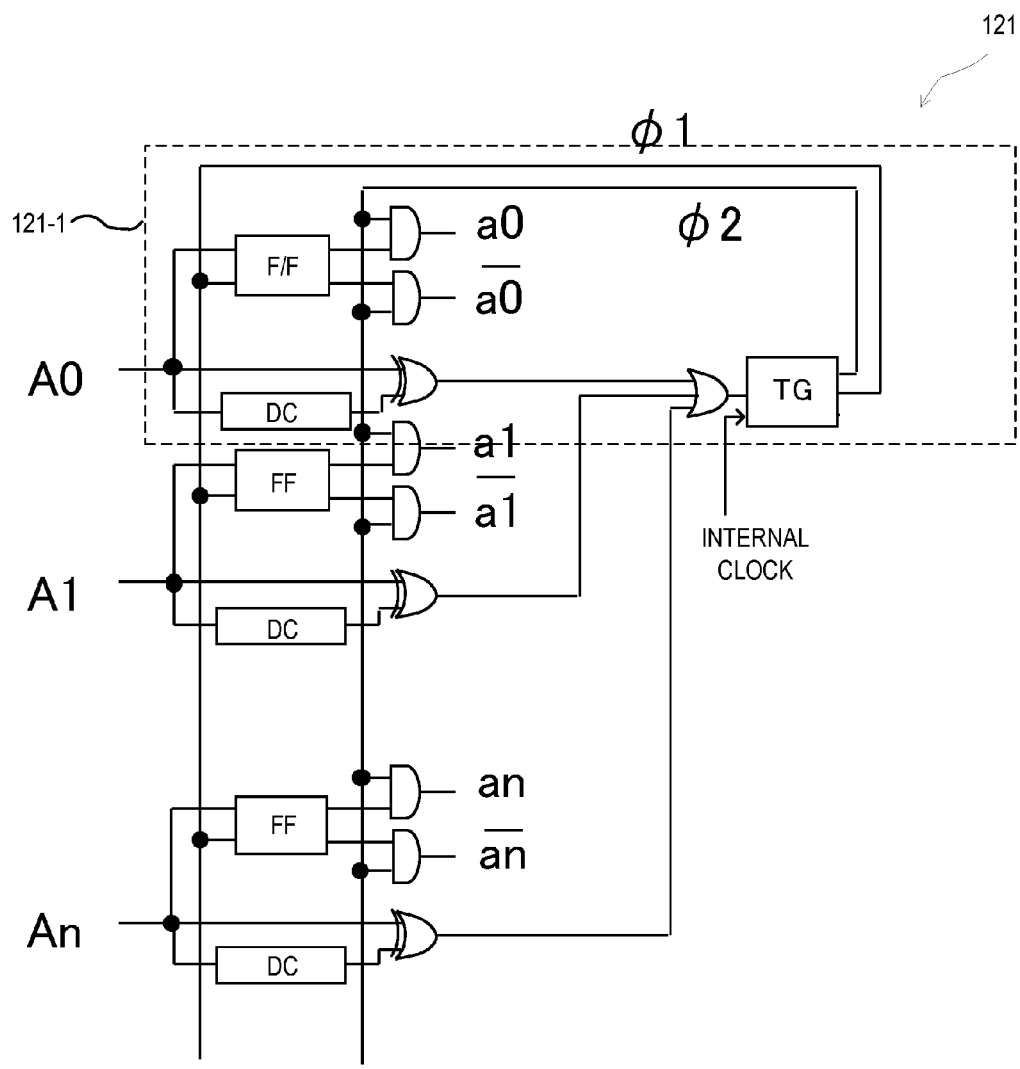
FIG. 7A is a detailed example of an ATD circuit.

FIG. 7A is a diagram showing one example of an ATD circuit. The ATD circuit 121 shown in FIG. 7A is configured by including, as shown as 121-1, a flip-flop (F/F), a delay circuit (DC), an AND circuit which performs AND calculation, an XOR circuit which performs exclusive OR calculation, an OR circuit which performs OR calculation, and a transmission gate (TG). The AND circuit, the XOR circuit and the OR circuit are shown by the MIL symbols.

The input of the XOR circuit is the address signal and a signal which delays the address signal. Accordingly, when there is transition in address signal during the delay, the transition in address signal is detected, and signal level [H] is output. In this manner, the ATD circuit 121 detects the address transition by the combination of the XOR circuit and the delay circuit.

Figure 7B:
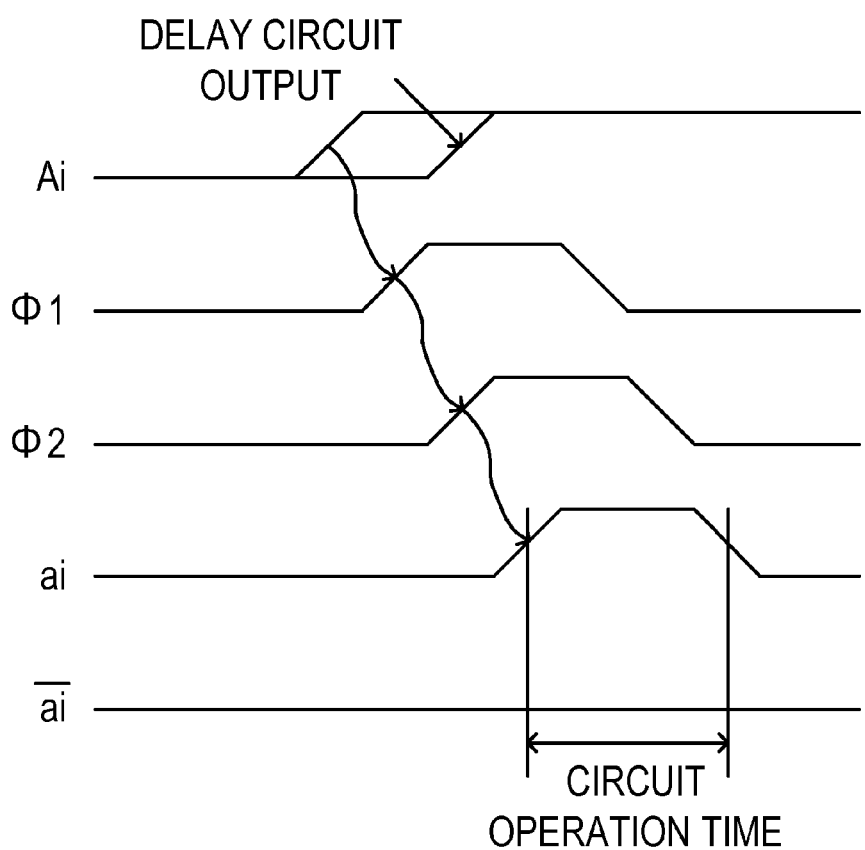
FIG. 7B is a time chart of a signal which flows through the ATD circuit.

FIG. 7B shows the time chart of the ATD circuit shown in FIG. 7A. "Ai" shown in FIGS. 7A and 7B corresponds to the address signal input from outside, and "ai" corresponds to the signal input which branches from the upper stage of the inverter circuit 120-1 shown in FIG. 4. The overlined "ai" represents the output signal of the inverter circuit 120-1 shown in FIG. 4, "$\phi1$" represents a return signal input from the TG to the clock of the flip-flop, and "$\phi2$" represents a return signal input to the AND circuit.

The flip-flop receives $\phi1$ synchronized with the internal clock as the clock, and retains the address signal at the edge rising of the clock.

When the address at the prior cycle and the address at the current cycle are different, the XOR circuit outputs a signal of signal level [H], and such signal is output from TG as $\phi2$. The flip-flop which receives $\phi2$ as the clock outputs the address retained in the cycle of $\phi1$. When the signal level of the address of $\phi1$ cycle output from the flip-flop at $\phi2$ cycle, and the signal level of $\phi2$ are the same, the AND circuit outputs the address of $\phi1$ cycle as address ai. In this manner, the ATD circuit outputs the changed address signal to the address decoder only when the address transition is detected.

Figure 8:
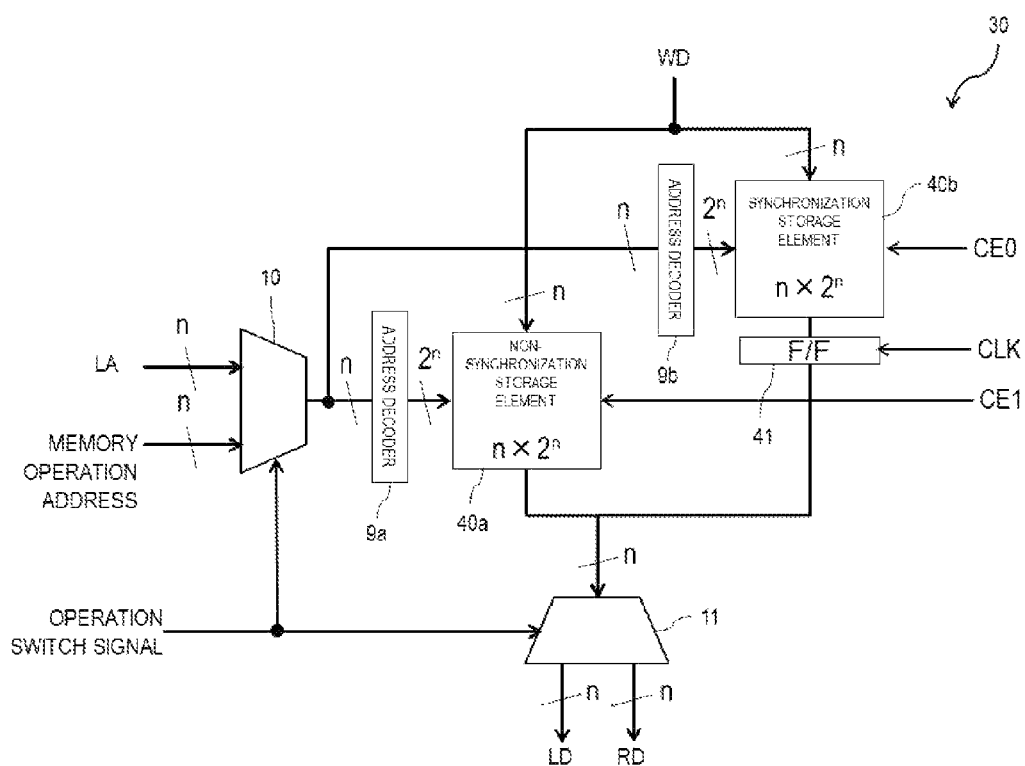
FIG. 8 is a second example of an MLUT capable of switching to and from synchronization and non-synchronization.

[1.2] A Second Example of an MLUT which is Capable of Switching to and from Synchronization and Non-Synchronization FIG. 8 is a second example of an MLUT capable of switching to and from synchronization and non-synchronization. The MLUT shown in FIG. 8 is configured by including a pair of a memory cell unit 40a for non-synchronization and a memory cell unit 40b for synchronization. The MLUT further includes an F/F 41 which synchronizes with the clock CLK, at the latter stage of the memory cell unit 40b for synchronization. Address decoders 9a and 9b are provided respectively for the memory cell unit 40a for non-synchronization and the memory cell unit 40b for synchronization. Further, an address switching circuit 10 which selects a memory operation or a logic operation in accordance with the operation switch signal, and an output data switching circuit 11 which selects read-out data RD or logic operation data LD in accordance with the operation switch signal are provided.

The memory cell unit configuring the MPLD 20 and the circuit units configured by the surrounding circuits are referred to as an MLUT. Data configuring the truth value table is stored in the memory cell unit, whereby the MLUT operates as the configuring element of the MPLD which is a reconfigurable device. The technical grounds for which the MPLD is used as the reconfigurable device are described later.

The MLUT does not always require two memory cell units as shown in FIG. 2, although each MLUT can be used for either synchronization or non-synchronization, and thus various usages are possible such as a synchronization memory, a logic element of a sequential circuit, a non-synchronization memory, a logic element of a combination logic circuit.

When the operation switch signal indicates a logic operation, the MLUT 30 shown in FIG. 8 outputs logic operation data LD in accordance with the logic operation address LA. Further, when the operation switch signal indicates a memory operation, the MLUT 30 receives write-in data WD or outputs read-out data RD in accordance with the memory operation address.

The address switch circuit 10 connects n number of memory operation address signal lines to which the memory operation address is input, n number of logic operation address input signal lines to which the logic operation address signal is input, and the operation switch signal lines to which the operation switch signal is input. The address switch circuit 10a operates so that either the memory operation address or the logic operation address is output to the n number of selection address signal lines, based on the operation switch signal. In this manner, the reason why the address switch circuit 10a selects the address signal lines is because the storage element 40 is a storage element of 1 port type which receives either one of the reading out operation and the writing in operation. In the logic operation, the CE (Chip Enable) 0, and CE 1 are activated at the same time, and OR (logical add) of the synchronization memory output and the non-synchronization memory output is output. In this manner, the combination circuit and the sequential circuit can be expressed. At the time of memory operation, such circuits are alternately activated, whereby a certain storage operation is performed.

For example, in the AD pair which instructs performing wiring and combination circuit (which is referred to as a pair of the logic operation address line of the MLUT and the logic operation data line connected thereto), a truth value of 0 is stored in the memory for synchronization, and a certain truth value is stored in the memory for non-synchronization, whereby signal transmission is performed by the data of non-synchronization memory. Accordingly, a logic circuit can be configured without clock delay in the memory. Further, in the sequential circuit, a certain truth value is stored in the memory for synchronization, and the truth value of 0 is set for the memory for non-synchronization. Accordingly, a sequential circuit of the clock operation can be configured. Thus, no special F/F is required in the sequential circuit configuration, which is efficient.

The address decoders 9a, 9b respectively decode the selection address signals received from the n number of address signal lines supplied from the address switch circuit 10, and output the decode signal to 2 to the nth power number of word lines.

The n×2n number of storage elements of the memory cell unit are disposed at the connection portions of the 2 to the nth power number of word lines, n number of writing in data lines, and n number of output data lines.

When the signal is received from n number of output data lines, the output data switch circuit 11 operates so as to output reading out data to n number of reading out data signal lines or output reading out data to the logic operation signal lines, in accordance with the input operation switch signal.

Figure 9:
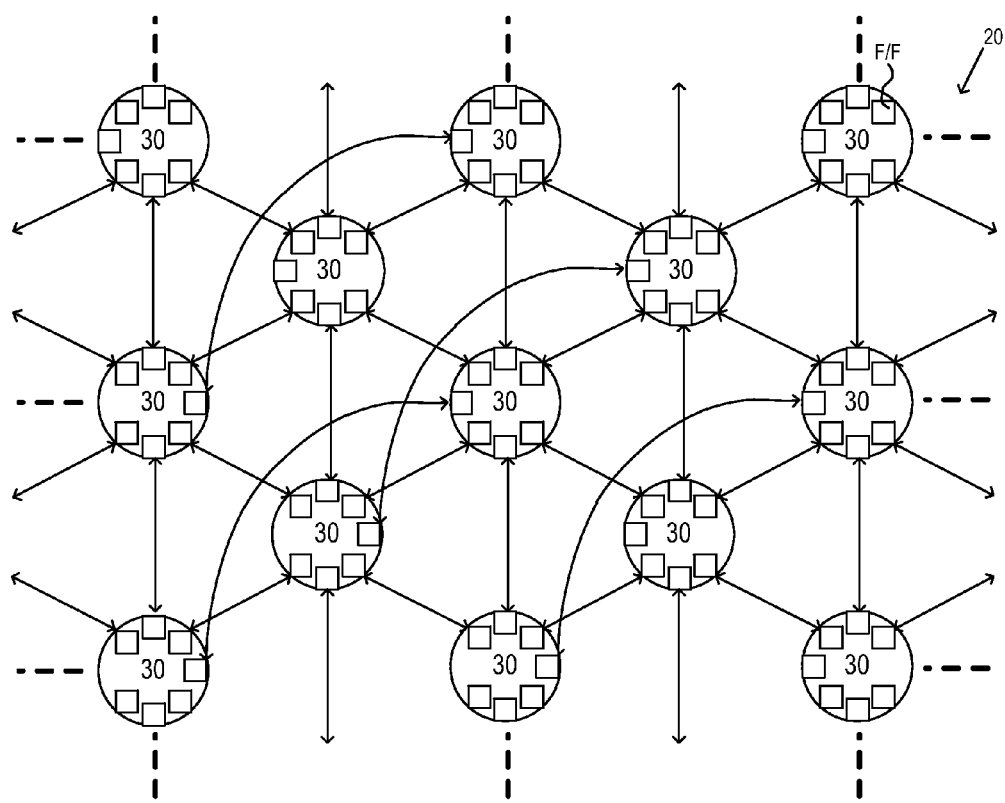
FIG. 9 is a diagram showing one example of an MPLD using the MLUT capable of switching to and from synchronization and non-synchronization.

[1.3] MPLD Using the MLUT Capable of Switching to and from Synchronization and Non-Synchronization FIG. 9 is a diagram showing one example of the MPLD using the MLUT capable of switching to and from onization and non-synchronization. The MPLD 20 shown in FIG. 9 includes a plurality of MLUTs 30. The rectangle inside the MLUT 30 is F/F provided for each data output line capable of being switched by the selection signal described in the semiconductor memory device. This F/F corresponds to the F/F of the data input/output unit 140.

A 6-directionally arranged MLUT may assign even connection for AD pairs, although in a circuit such as a multiplication circuit having two CLA (carrier look ahead) circuits, a circuit cannot be realized in its own MLUT, and the logic configuration efficiency is inferior in that one more MLUT is required. (Here, in the 6-directionally arranged MLUT, 6 MLUTs are arranged around one MLUT, and the MLUT in the center and the surrounding 6 MLUTs are connected with each other by one AD pair, respectively. In other words, 6 address lines of the MLUT are connected to the data lines of the other 6 MLUTs arranged in the surroundings, and 6 data lines of the MLUT are connected to the address lines of the other 6 MLUTs.) On the other hand, an alternate arrangement may assign two AD pairs to the adjacent MLUT, whereby the alternate arrangement is advantageous in this case. (Here, in the alternate arrangement, 8 MLUTs are arranged around one MLUT, and surrounding 4 MLUTs and AD pairs are connected to each other, among which two MLUTs are connected to two AD pairs. Such configuration is disclosed, for example in Japanese Patent Application Laid-open Publication No. 2010-239325).

However, the MLUTs in the alternate arrangement can reduce the number of MLUTs which operate as the connection element, whereby the total amount of the storage element blocks configuring the desired logic circuits can be reduced. Accordingly, it is preferable that MLUTs of alternate arrangement are used if at all possible.

Further, in the connection between MLUTs in the conventional method, a distant wiring realizes wiring by AD pairs 7 by jumping MLUTs, whereby MLUTs can be saved in the long distant wiring. (Here, the distant wiring is referred to as the wiring of AD pairs connecting the MLUTs not being wired by short distances. Such wiring is disclosed for example, in Japanese Patent Application Laid-open Publication No. 2010-239325.) When AD pairs 7 are used and F/F required for the sequential circuit is connected, the F/F has a configuration of returning back to MLUT. Further, the distant wiring and the F/F are mixed at a certain ratio. When a sequential circuit is configured in this relationship, MLUTs as the connection element are required, and the logic configuration efficiency is inferior.

As shown in FIG. 9, since the MLUT itself has F/F, and does not need to use the AD pairs in order to be connected to F/F located outside, the entire AD pairs 7 can be used for the distant wiring.

By using the MLUT capable of switching to and from synchronization and non-synchronization, the circuits realized by the MLUT can be divided inside the MLUT into a circuit which requires synchronization and a circuit which does not require synchronization, or one MLUT can be used in both ways of a circuit which dynamically requires synchronization and a circuit which does not require synchronization. For example, an MLUT can be set for each data line so as to be non-synchronized for each data line as an internal clock when non-synchronization is necessary for a combination circuit or a wiring logic, and to be synchronized for each data line in the external clock at the time of a sequential circuit.

[2] Arrangement Wiring Method

In order to perform arrangement wiring of an MPLD, an arrangement wiring method is necessary in which net list (wiring information to connect between elements) is generated from a hardware description language pertaining to abstract operations of circuits, and the same is allotted to the actual digital circuits (hereinbelow, referred to as "logic synthesis"). As the function mounting example of MPLD, a method of selecting circuit groups subjected to the logic synthesis and sequentially arranging the same from the input pin can be conceived. However, the arrangement must be performed in consideration of securing the area of circuits to be arranged afterwards. Further, when the combination circuit and the sequential circuit are performed without being sorted, the arrangement must be considered again since the arrangement is to be a failure when the circuits are arranged in the MLUT without F/F. At this time, the wiring logic is performed until reaching the MLUT with F/F, and is to be inferior in arrangement wiring efficiency in that it requires many MLUTs.

In the arrangement wiring method according to the present embodiment, the truth value table in which F/F is scanned is generated, and F/F is configured by the MLUT. Accordingly, wiring elements between the combination circuits to realize desired logic and F/F are reduced, and the arrangement wiring efficiency of MPLD is improved.

In C language, the main operation is the calculation of registers and therebetween. The registers are F/F and the calculation is combination logic, whereby the logic synthesis from C language is basically possible. The arrangement of F/F is determined from register declaration, and the truth value data is generated from the calculation operation, whereby the logic synthesis is possible without performing logic circuit synthesis. Conventionally, the logic synthesis of a reconfigurable device, especially the synthesis from C language requires arrangement wiring by conversion to RTL description (Verilog, VHDL), followed by generation of logic circuits. Accordingly, several pieces of information processing were required, which was troublesome. In the arrangement wiring method according to the present embodiment, the logic synthesis from C language is possible, and a simple method can be supplied to the industry.

For the MPLD, the production of the truth value table and the operation of writing the truth value table into the MLUT correspond to the arrangement wiring in FPGA. Hereinbelow, the arrangement wiring method according to the present embodiment is described with reference to FIGS. 11-15.

Figure 10:
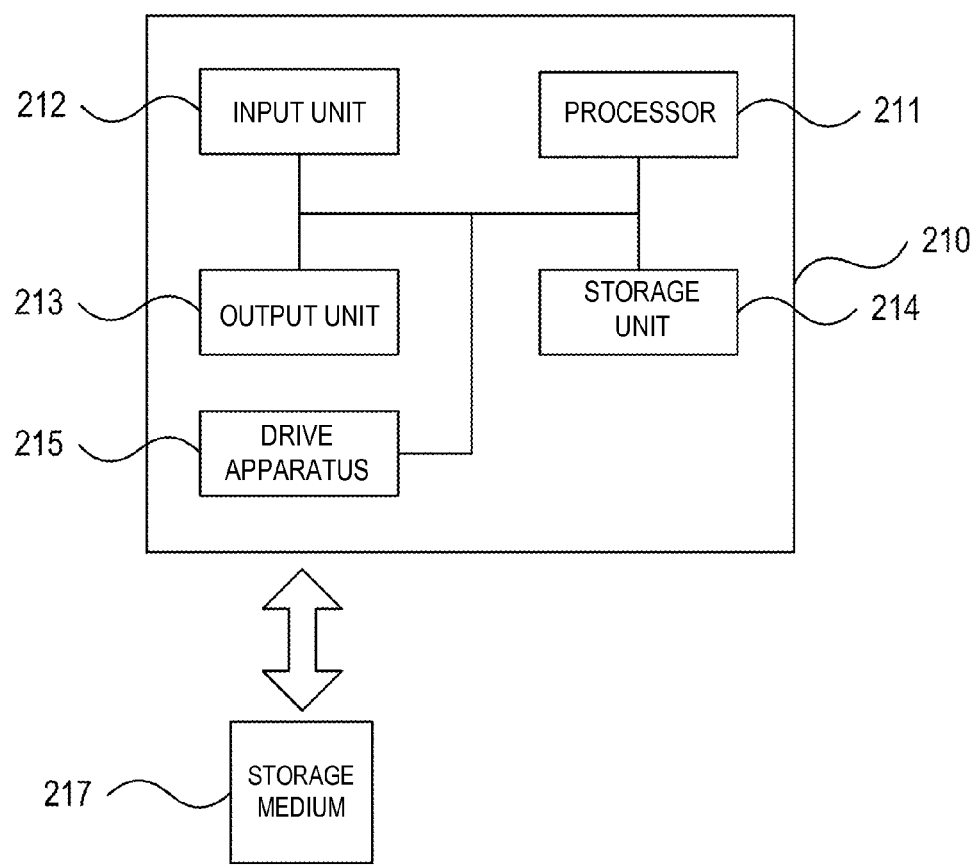
FIG. 10 is a diagram showing one example of a hardware configuration of an information processing apparatus.

Note that the arrangement wiring method is realized by an information processing apparatus which executes software programs for the arrangement wiring according to the present embodiment. FIG. 10 shows one example of the hardware configuration of the information processing apparatus. The information processing apparatus 210 includes a processor 211, an input unit 212, an output unit 213, a storage unit 214, and a drive apparatus 215. The processor 211 stores, in the storage unit 214, the software for arrangement and wiring input to the input unit 212, the circuit description language such as C language description or hardware description language (HDL) to design integrated circuits, and the truth value table data generated by executing the above described software. Further, the processor 211 executes the software for arrangement and wiring, performs the following processing of arrangement and wiring for the circuit description stored in the storage unit 214, and outputs the truth value table data to the output unit 213. The output unit 213 can be connected with the semiconductor device 100 (which is not shown), and writes the truth value table data generated by the processor 211 executing the arrangement and wiring processing into the semiconductor device 100 through the output unit 213. The output unit 213 may be connected to an external network. In such case, the software program for arrangement and wiring is received and transmitted via the network. The drive apparatus 215 is an apparatus which reads out and writes in data to and from the storage medium 217 such as DVD (Digital Versatile Disc), flash memory, and the like. The drive apparatus 215 includes motors to rotate the storage medium 217, the head which reads out and writes in data on the storage medium 217, and the like. Note that the storage medium 217 can store the program for arrangement and wiring. The drive apparatus 215 reads out programs from the set storage medium 217. The processor 211 stores programs read out by the drive apparatus 215 into the storage unit 214. Note that the information processing apparatus 210 operates as the arrangement and wiring apparatus which executes the arrangement and wiring method according to the present embodiment.

Figure 11:
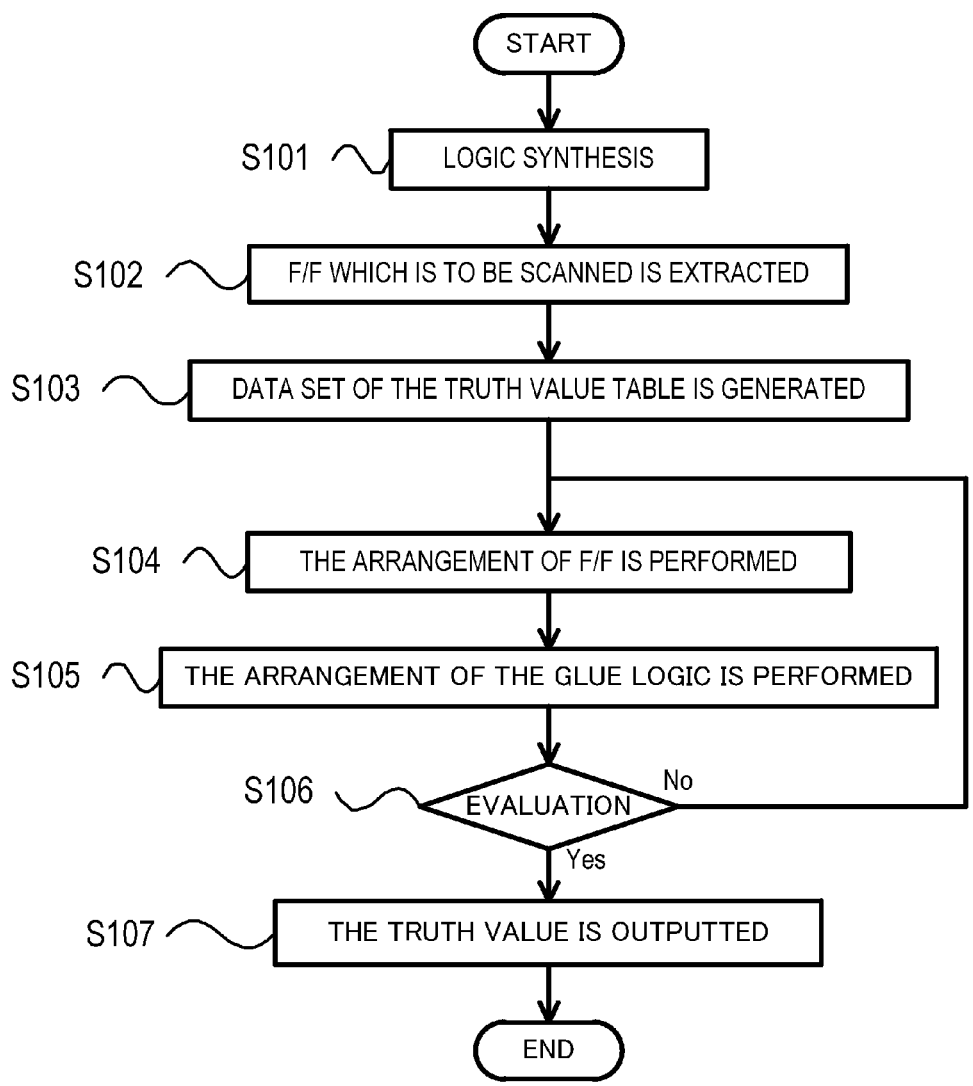
FIG. 11 is a flow chart showing one example of arranging and wiring processing.
Figure 12:
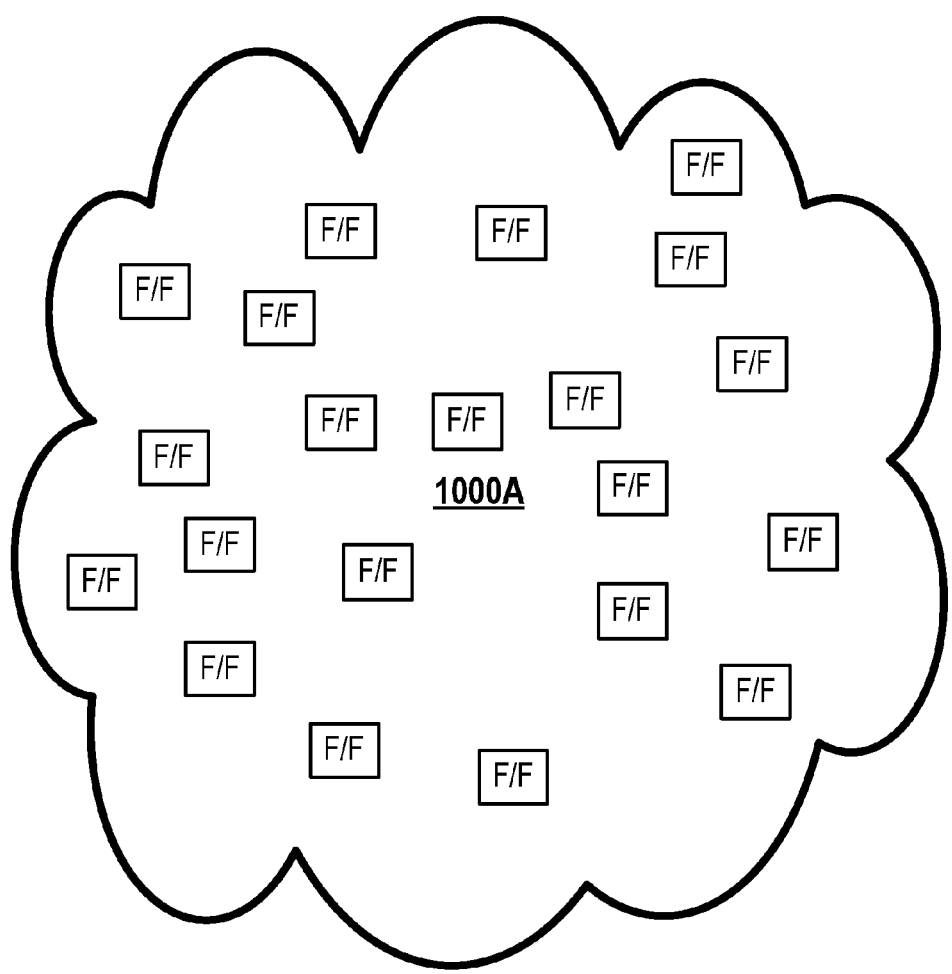
FIG. 12 is a diagram showing an outline of a glue logic which is an actual circuit diagram created by a logic synthesis and F/F.

FIG. 11 is a flow chart showing one example of the arrangement and wiring processing. The arrangement and wiring processing shown in FIG. 11 is executed by the information processing apparatus shown in FIG. 10. First, the logic synthesis is performed (S 101). The logic synthesis is referred to as generation of logic operation in the broad sense, although in the present embodiment, the same is referred to as generation of a net list (expression style of design data in gate level describing the list of wiring connecting between the elements) from the circuit description language in the narrow sense. FIG. 12 schematically shows the glue logic 1000A which is the actual circuit diagram generated by the logic synthesis and F/F. The logic circuits include the combination circuit and the sequential circuit, although the combination logic circuit is referred to as the glue logic.

Next, F/F which is to be scanned is extracted for the circuits generated by the logic synthesis (S 102). In the scanning, the register in the logic circuit is optimally arranged with F/F by replacing the F/F inside the circuit subjected to the logic synthesis with F/F with scan function (scan F/F). Note that since when the F/F is randomly scanned, the wirings are crossed, and effective short chain wiring cannot be configured, the register is extracted so as to form the optimal and shortest chain in consideration of the logic state. The extraction of the F/F to be scanned is performed by extracting the F/F from the net list. By the extraction processing, F/F to be scanned is specified in the net list.

Figure 13:
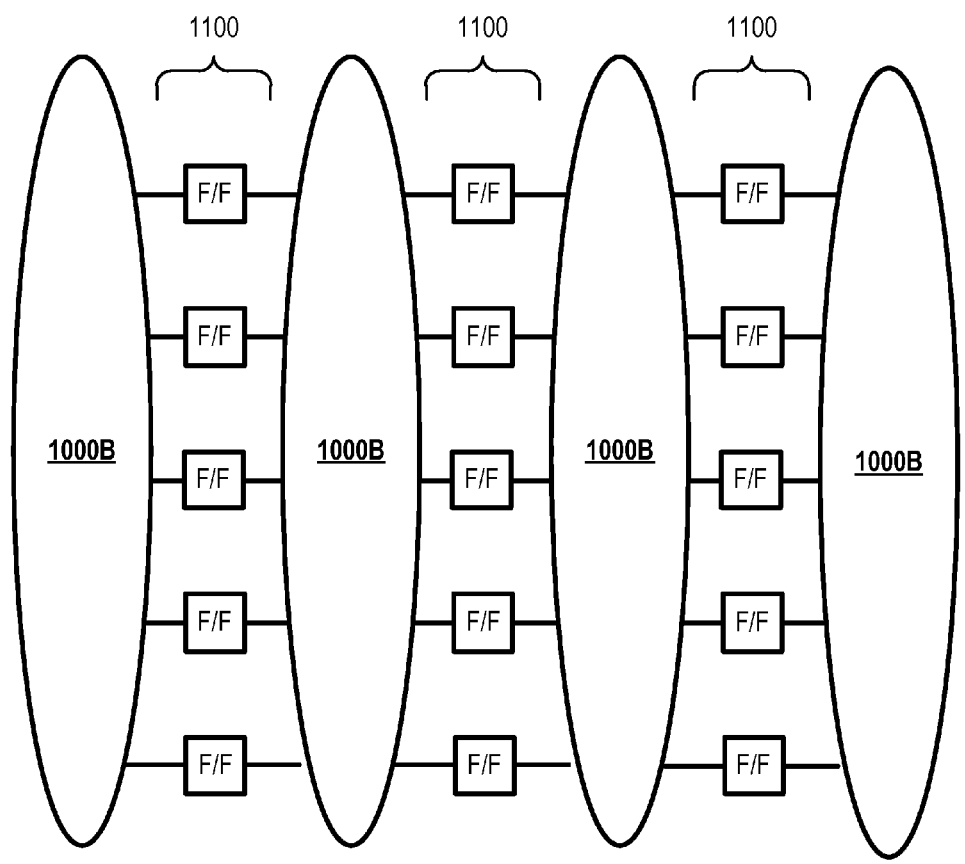
FIG. 13 is a diagram showing an outline of a glue logic newly created by scanning, and a scan F/F.

FIG. 13 schematically shows the glue logic newly generated by the scanning, and the scan F/F. By the scanning, the glue logic 1000A shown in FIG. 12 is configured into the glue logic 1000B to be connected to the scan F/F 1100, and the F/F inside the circuit shown in FIG. 12 is replaced with the scan F/F 1100. Further, by such procedure, the scan F/F 1100 is arranged so as to sandwich the glue logic 1000B. When FIGS. 12 and 13 are compared, it can be understood that the connection relationship between the glue logic and the F/F is more simplified in FIG. 12. By such simplification, the wiring logic necessary for the connection between the F/F and the glue logic can be largely reduced.

As for the arrangement wiring, the arrangement wiring of the conventional MPLD is configured so as to arrange and wire the circuits in the MLUT without distinguishing the combination circuit and the sequential circuit. Since the combination circuit and the wiring of the MLUT are configured by the storage information of the memory in the MPLD, when the glue logic and the F/F are mixed as shown in FIG. 12, and the arrangement and wiring are performed as they are, the wiring logic to connect the F/F and the combination logic circuit is to be required, whereby the synthesis efficiency is decreased due to the increase of the wiring logic. However, when the sequential circuit is arranged first, the amount of the wiring logic to connect the F/F and the combination logic circuit is relatively decreased, whereby the wiring logic between the combination circuits can be reduced.

Data set of the truth value table is generated from the F/F which is to be scanned specified by the extraction processing (S 103). The scan F/F 1100 is extracted. Then, since plurality of MLUTs are required in between the F/F subjected to logic synthesis, the truth value table data to express the combination circuit is generated. Naturally, since the F/F includes the wiring logic, the generated truth value table data includes the table truth value of the logic state between the F/F in the wiring logic. The plurality of pieces of the truth value table data so as to be written into the plurality of MLUTs to be generated express the connection state between the F/F, whereby the wiring logic between the glue logic and the F/F shown in FIG. 12 is not generated.

Next, the arrangement of F/F is performed (S 104). In this step, processing is performed in which the truth value data for F/F is allotted to the MLUT selected in synchronization. Such processing is one in which the truth value table is allotted to the simulated MLUT. Note that in the simulation of MLUT, when the truth value table to realize the circuit description is written into the MLUT, at least a timing analysis to measure the operation speed is performed. Accordingly, in such simulation environment, the wiring length corresponding to the number of MLUTs to realize the desired circuit description is measured, the signal delay by the wiring length is calculated, and the timing analysis such as the clock synchronization is performed.

Then, the arrangement of the glue logic is performed (S 105). In this step, the processing in which the truth value data of the glue logic is allotted to the MLUT selected with non-synchronization is performed. Such processing is one in which the truth value table is allotted to the simulated MLUT.

Note that in S 105, the division or linkage of MLUTs may be performed when necessary. The division or linkage of MLUTs is to make the net list suitable for the MLUTs. In the dividing step, the number of input and output of the logic circuit is made to be the same or less than the certain number of AD pairs, so that certain logic circuit is included in one truth value table to be allotted to one MLUT. The linkage is to assemble two or more truth value tables which can be included in one MLUT into one truth value table, so as to optimize the number of the truth value tables configured by the MLUTs. The number of the truth value tables configured by the MLUTs can be optimized by such division and linkage of MLUT.

Next, the MLUT allotted with the truth value table is evaluated whether or not the conditions such as the certain number of MLUTs and the operation speed, and the like, are satisfied (S 106). When the evaluation satisfies the conditions (S 106, Yes), the actual truth value table data is generated, is stored in the storage unit 214 and/or is written into the MPLD via the output unit 213, and performs the processing of operating the same. At this time, the generated truth value table generates a first truth value table data set to be written into the first set among the plurality of MLUTs from the sequence circuit data set to be scanned and is extracted from step S 103 (which is scan F/F), and a second truth value table data set to be written into the second set among the among the plurality of MLUTs from the combination logic circuit data set of the net list. When the evaluation does not satisfy the conditions (S 106, No), the processing returns to S 104, and repeats the rearrangement of the F/F and the glue logic to the MLUT.

Figure 14:
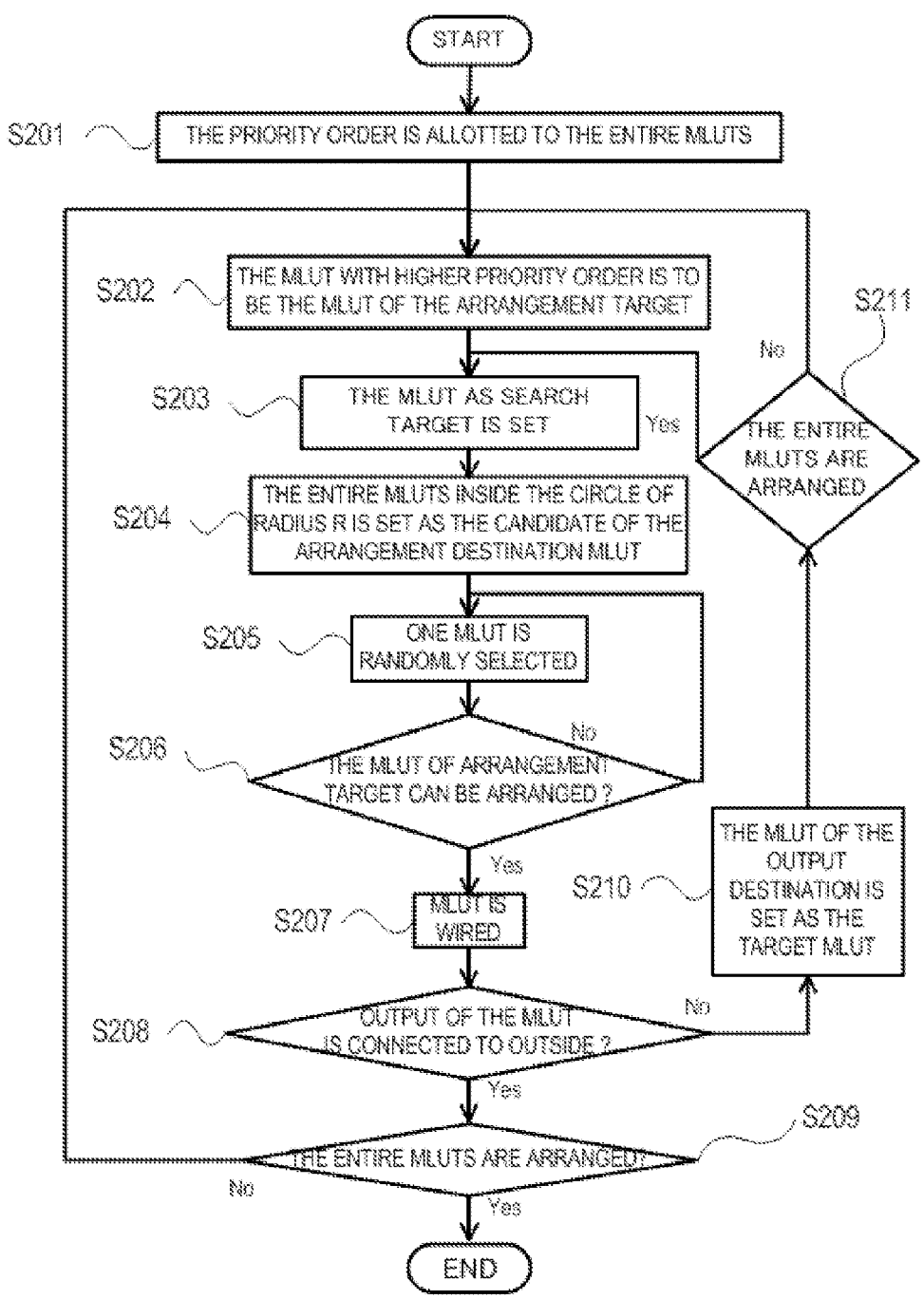
FIG. 14 is a flow chart showing one example of an evaluation method of allotting MLUTs.
Figure 15:
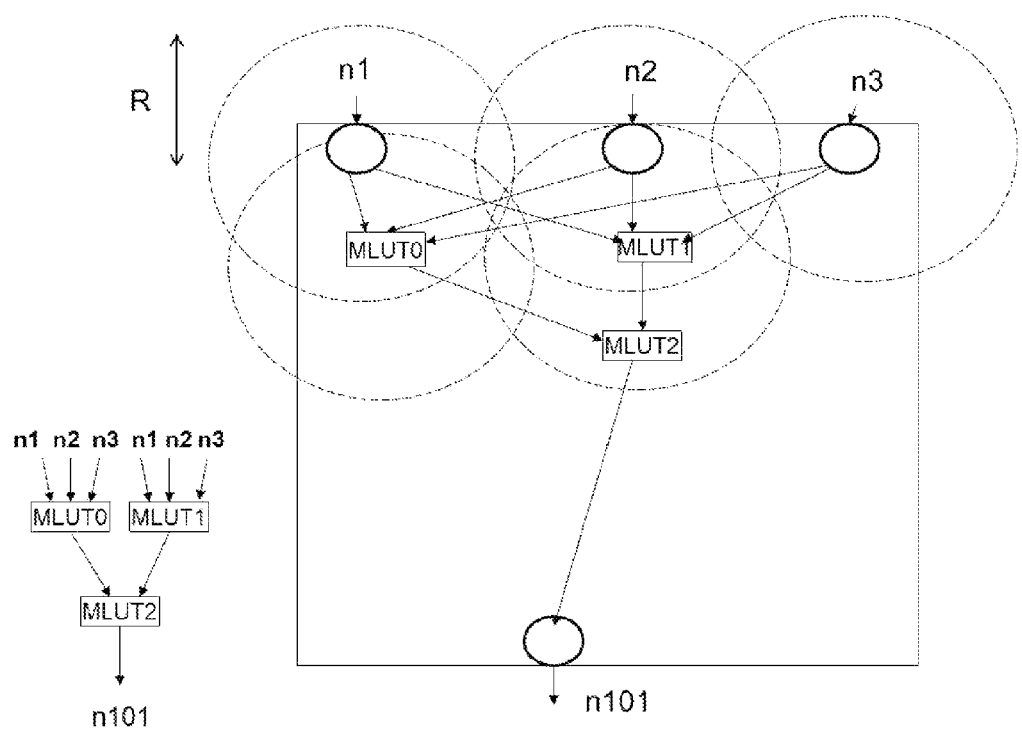
FIG. 15 is a conceptional diagram showing an example of an MLUT allotting evaluation.

FIG. 14 shows a flow chart of one example of the evaluation method to allot the MLUT. FIG. 15 is a conceptional diagram showing the example of the evaluation of the MLUT allocation. Such processing is realized by the information processing apparatus to execute the software programs stored in the storage unit shown in FIG. 10.

First, the priority order is allotted to the entire MLUTs (S 201). The MLUT with higher priority order is to be the MLUT of the arrangement target (S 202). The MLUT which generates its own input signal with regard to the arrangement target MLUT or the MLUT in which an external input is placed is set as the MLUT of search target (S 203). The entire MLUTS inside the circle of radius R shown in FIG. 15 from the search base point MLUT is set as the candidate of the arrangement destination MLUT (S 204). One MLUT is randomly selected from the candidates (S 205). Whether or not the MLUT of arrangement target can be arranged to the selected MLUT is judged (S 206), and is wired (S 207). Then, whether or not the output of the MLUT of arrangement target is connected to outside is judged (S 208). When the output of the MLUT of arrangement target is connected to outside (S 208, Yes), it is judged whether the entire MLUTs are arranged (S 209), and when the entire MLUTs are arranged (S209, Yes), the processing is finished. The example of S 208 is described with reference to FIG. 15. The MLUT 2 judges whether being connected to the outside n101, and when the MLUT 2 is connected thereto, the MLUT 2 judges whether the entire MLUTs 0-2 are arranged, and when arranged, the processing is finished.

When the output of the MLUT of arrangement target is not connected to the outside (S 208, No), the MLUT of the output destination is set as the target MLUT (S 210). For example, in FIG. 15, the output destination of MLUT for the MLUT0 or MLUT1 is MLUT 2. Next, it is judged whether or not the entire MLUTs of the input destination of the arrangement target MLUT are arranged (S 211). When the entire MLUTs are arranged (S 211, Yes), the processing returns to S 203. When the entire MLUTs of the input destination of the arrangement target MLUT are not yet arranged (S 211, No), the processing returns to S202.

[3] Truth Value Table Making MLUT Work as Logic or Connection Element

A. Logic Element

Figure 16:
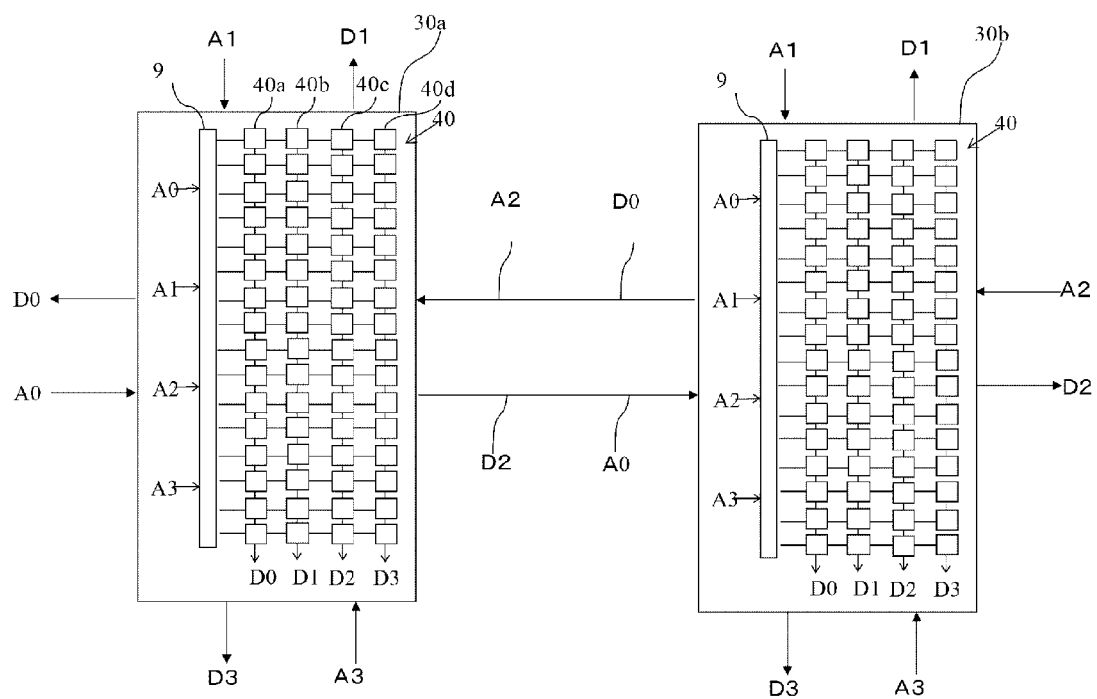
FIG. 16 is a diagram showing one example of an MLUT which operates as a logic element.

FIG. 16 is a view showing one example of the MLUT which operates as a logic element. The MLUT shown in FIG. 16 is similar to MLUT shown in FIG. 10 or semiconductor devices shown in FIG. 1, FIG. 4, or FIG. 7 as a circuit. The address switching circuit 10a and the output data switching circuit 10b are omitted in FIG. 24 for simplifying the explanation. The MLUTs 30a, 30b shown in FIG. 16 have four number of logic operation address lines A0·A3, four number of logic operation data lines D0~D3, 4×16=64 number of storage elements 40, and an address decoder 9 respectively. The logic operation data lines D0~D3 connect serially 24 number of storage elements 40 respectively. The address decoder 9 is configured to select four number of storage elements which are connected to either 24 number of word lines according to signals entered into the logic operation address lines A0~A3. These four storage elements are respectively connected to the logic operation data lines D0~D3 and output data memorized in the storage element to the logic operation data lines D0~D3. For instance, it may be configured to select four storage elements 40a, 40b, 40c, and 40d in case of appropriate signals entered into the logic operation address lines A0~A3. Here, the storage element 40a is connected to the logic operation data line D0. The storage element 40b is connected to the logic operation data line D1. The storage element 40d is connected to the logic operation data line D2. The storage element 40d is connected to the logic operation data line D3. And, the signals which are memorized in the storage elements 40a~40d are outputted to logic operation data lines D0~D3. Therefore, the MLUTs 30a, 30b receive logic operation addresses from the logic operation address lines A0~A3 and output as logic operation data, which are values memorized in the four storage elements 40 selected by the address decoder 9 according to the logic operation addresses, to the logic operation data lines D0~D3 respectively. Note that the logic operation address line A2 of the MLUT 30a is connected to the logic operation data line D0 of adjacent the MLUT 30b. The MLUT 30a receives data as the logic operation address output from the MLUT 30b. And, the logic operation data line D2 of the MLUT 30a is connected to the logic operation address line A0 of the MLUT 30b. The MLUT 30b receives data as the logic operation address output from the MLUT 30a. For instance, the logic operation data line D2 of the MLUT 30a outputs a signal, which is memorized in any one of 24 number of storage elements connected to the logic operation data line D2, to the logic operation address A0 of the MLUT 30b in accordance with signals entering into the logic operation address lines A0~A3 of MLUT 30a. Similarly, the logic operation data line D0 of the MLUT 30b outputs a signal, which is memorized in any one of 24 number of storage elements connected to the logic operation data line D0, to the logic operation address A2 of the MLUT 30a in accordance with signals entering into the logic operation address lines A0~A3 of the MLUT 30b. In this manner, one pair of the address line and the data line is used for connecting the MPLDs with each other.

Note that the number of AD pairs included in the MLUTs 30a, 30b shown in FIG. 16 is four. However, the number of the AD pairs is not limited to four, as described later.

Figure 17:
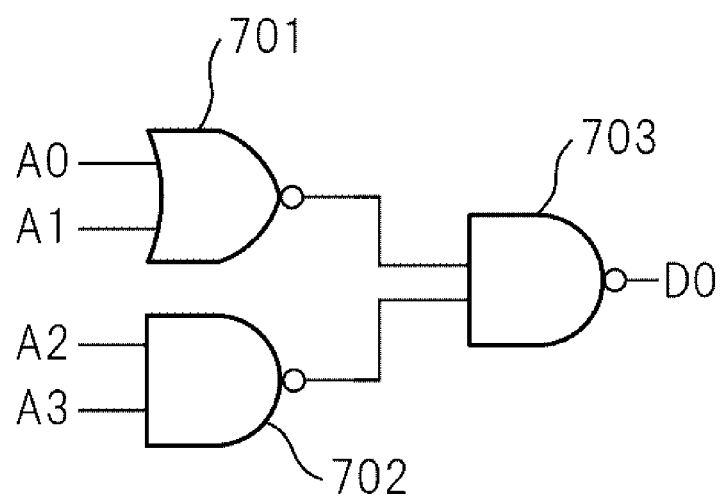
FIG. 17 is a diagram showing one example of an MLUT which operates as a logic circuit.

FIG. 17 is a view showing one example of the MLUT which operates as a logic circuit. In this example, the logic circuit is configured in the following manner. That is, the logic operation address lines A0 and A1 are inputs of a 2-input NOR circuit 701, and the logic operation address lines A2 and A3 are inputs of a 2-input NAND circuit 702. Further, an output of the 2-input NOR circuit 701 and an output of the 2-input NAND circuit 702 are inputted to a 2-input NAND circuit 703, and an output of the 2-input NAND circuit 703 is outputted to the logic operation data line D0.

FIG. 18 is a view showing a truth table of the logic circuit of FIG. 17. Since the logic circuit of FIG. 17 has four inputs, all inputs from the inputs A0-A3 are used as inputs. On the other hand, since the logic circuit only has one output, only the output D0 is used as an output. In each field for the outputs D1-D3 in the truth table, "*" is described. This means that the value may take either "0" or "1". However, when actually writing in the truth table data into the MLUT for reconfiguration, either one value of "0" or "1" needs to be written into these fields.

B. Connection Element

Figure 19:
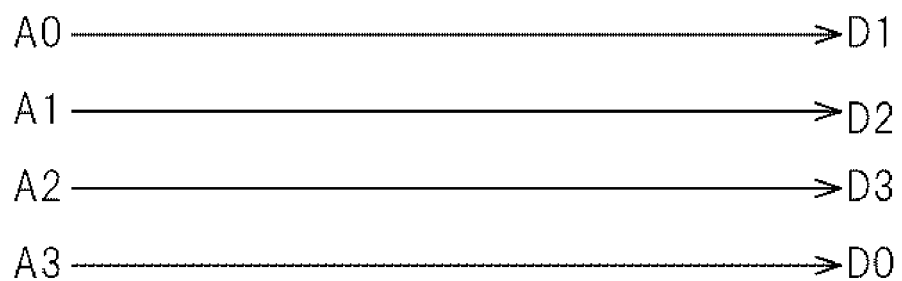
FIG. 19 is a diagram showing one example of an MLUT which operates as a connection element.

FIG. 19 is a view showing one example of the MLUT which operates as a connection element. In FIG. 19, the MLUT as the connection element operates to output a signal of the logic operation address line A0 to the logic operation data line D1, output a signal of the logic operation address line A1 to the logic operation data line D2, and output a signal of the logic operation address line A2 to the logic operation data line D3. The MLUT as the connection element further operates to output a signal of the logic operation address line A3 to the data line D1.

FIG. 20 is a view showing a truth table of the connection element of FIG. 19. The connection element shown in FIG. 19 has four inputs and four outputs. Accordingly, all inputs from the inputs A0-A3 and all outputs to the outputs D0-D3 are used. The MLUT operates as a connection element which outputs the signal of the input A0 to the output D1, outputs the signal of the input A1 to the output D2, outputs the signal of the input A2 to the output D3, and outputs the signal of the input A3 to the output D0, in accordance with the truth table shown in FIG. 20.

Figure 21:
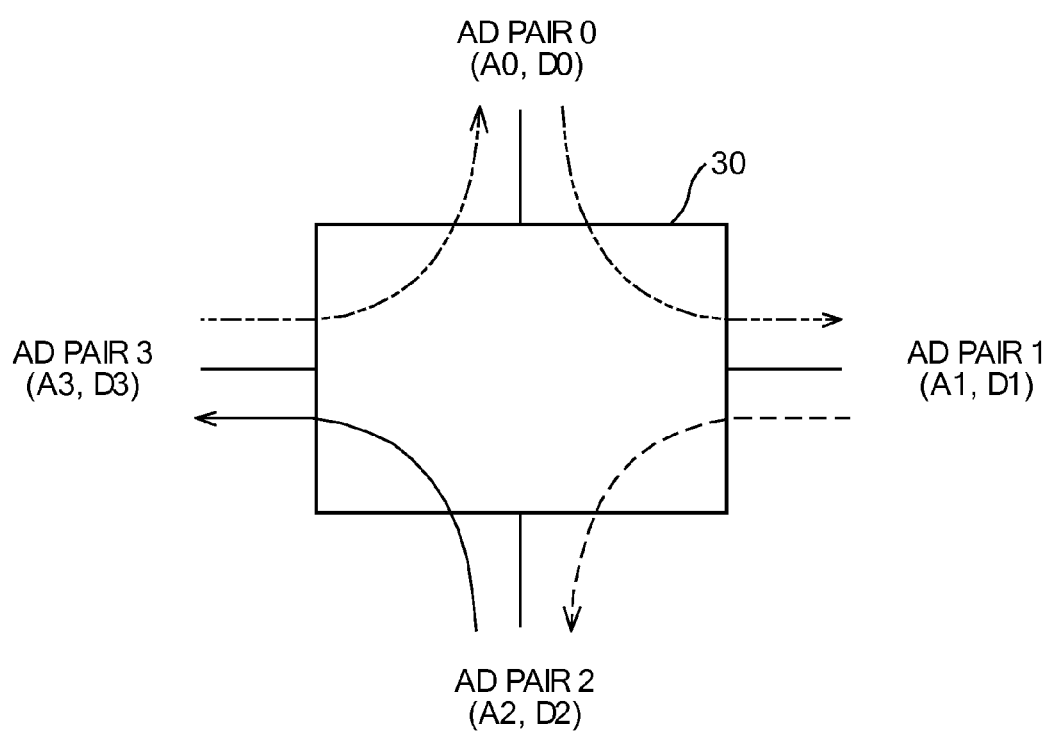
FIG. 21 is a diagram showing one example of a connection element which is realized by an MLUT having four AD pairs.

FIG. 21 is a view showing one example of the connection element realized by the MLUT including four AD pairs. AD0 comprises the logic operation address line A0 and the logic operation data line D0. AD1 comprises the logic operation address line A1 and the logic operation data line D1. AD2 comprises the logic operation address line A2 and the logic operation data line D2. And, AD3 comprises the logic operation address line A3 and the logic operation data line D3. A chain line illustrated in FIG. 21, shows signal flow that a signal, which is entered into the logic operation address line A0 of the AD pair 0, is output to the logic operation data line D1 of the AD pair 1. A two-dot chain line illustrated in FIG. 21, shows signal flow that a signal, which is entered into the logic operation address line A1 of the second AD pair 1, is output to the logic operation data line D2 of the AD pair 2. A dash line shows signal flow that a signal, which is entered into the logic operation address line A2 of the AD pair 2, is output to the logic operation data line D3 of the AD pair 3. A solid line shows signal flow that a signal, which is entered into the logic operation address line A3 of the AD pair 3, is output to the logic operation data line D0 of the AD pair 0.

Note that although the MLUT 30 comprises the four number of the AD pairs shown in FIG. 21, the number of the AD pairs is not especially limited the number of four.

C. Combination Function of Logic Element and Connection Element

Figure 22:
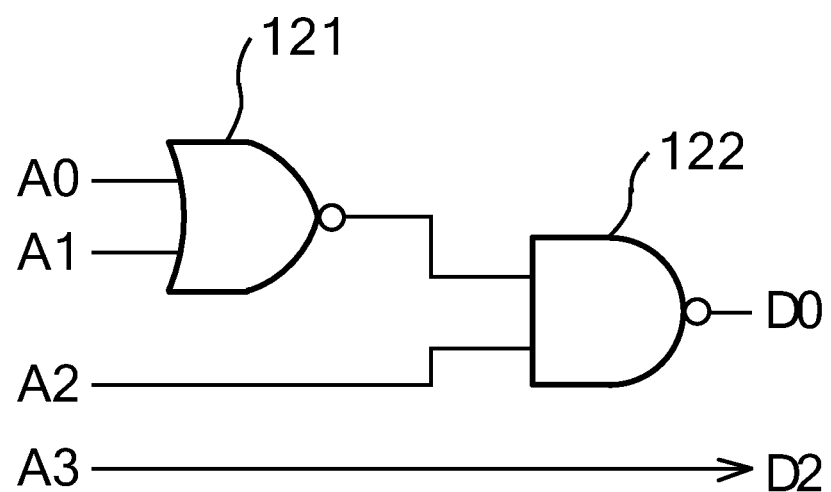
FIG. 22 is a diagram showing one example in which one MLUT operates as the logic element and the connection element.

FIG. 22 is a view showing one example of a single MLUT which operates as the logic element and the connection element. In the example shown in FIG. 22, the logic circuit is configured in the following manner. That is, the logic operation address lines A0 and A1 are inputs of a 2-input NOR circuit 121, an output of the 2-input NOR circuit 121 and the logic operation address line A2 are inputs of a 2-input NAND circuit 122, and an output of the 2-input NAND circuit 122 is outputted to the data line D0. Further, at the same time, a connection element which outputs the signal of the logic operation address line A3 to the logic operation data line D2 is configured.

FIG. 23 is a view showing a truth table of the logic element and the connection element of FIG. 22. The logic operation of FIG. 22 uses inputs D0~D3 as three inputs, and one output D0 as an output. On the other hand, the connection element of FIG. 23 configures a connection element which outputs the signal of the input A3 to the output D2.

Figure 24:
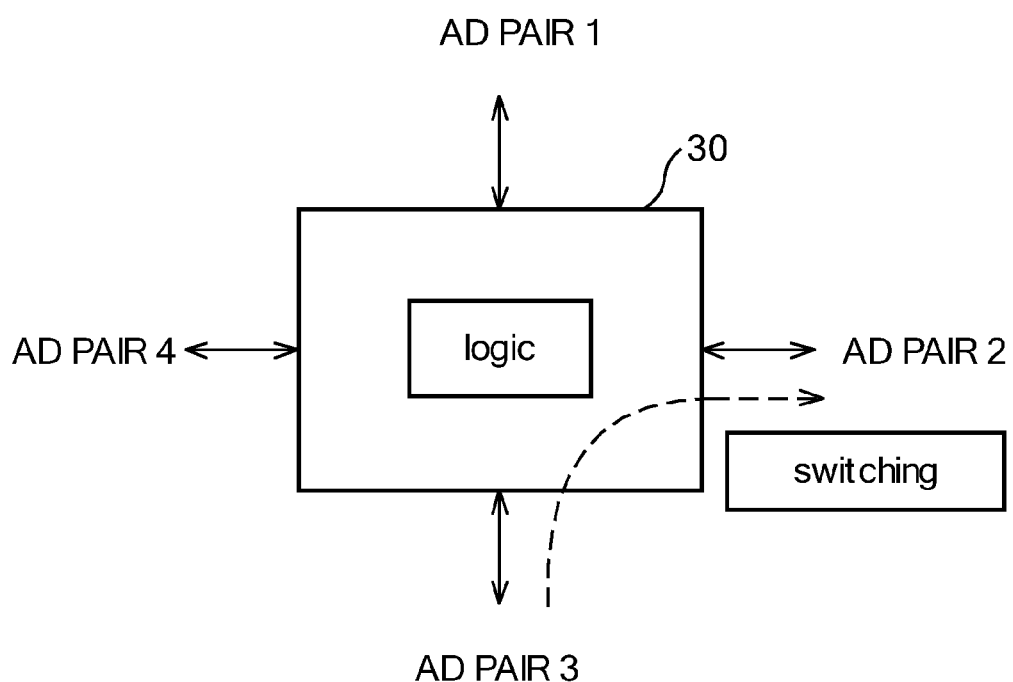
FIG. 24 is a diagram showing one example of the logic operation and the connection element realized by MLUT which has AD pairs.

FIG. 24 is a view showing one example of the logic operation and the connection element realized by the MLUT including the AD pairs. Along with the MLUT shown in FIG. 21, AD0 comprises the logic operation address line A0 and the logic operation data line D0. AD1 comprises the logic operation address line A1 and the logic operation data line D1. AD2 comprises the logic operation address line A2 and the logic operation data line D2. And, AD3 comprises the logic operation address line A3 and the logic operation data line D3. As described above, the MLUT 30 realizes two operations of the logic operation (three inputs and one output) and the connection element (one input and one output) by a single MLUT 30. Concretely, the logic operation uses the logic operation address line A0 of the AD pair 0, the logic operation address line A1 of the AD pair 1, and the logic operation address line A2 of the AD pair 2 as the inputs. And, the address line of the logic operation data line D0 of the AD pair 0 is used as the output. Also, the connection element outputs the signal inputted to the logic operation address line A3 of the AD pair 3 to the logic operation data line D2 of the AD pair 2 as shown in a dashed line.

Although the embodiments of the present invention have been described in detail, it should be understood that the various changes, substitutions, and alterations could be made hereto without departing from the spirit and scope of the invention.

DESCRIPTION OF SYMBOLS

20 MPLD
30 MLUT
100 semiconductor device
200 analog circuit unit

What is claimed is:
1. An arrangement and wiring method of a reconfigurable semiconductor device, characterized by comprising:
generating a net list based on a circuit description in which a circuit configuration is described;

extracting a sequential circuit data set which is to be scanned from the net list;

generating a first truth value table data set so as to write into a first set among plurality of memory cell units from the sequential circuit data set which is to be scanned; and generating a second truth value table data set so as to write into a second set among the plurality of memory cell units from a combination logic circuit data set of the net list;

wherein the reconfigurable device includes the plurality of memory cell units configuring arrays and are connected to each other, and the memory cell units operate as a logic element when truth value table data is written in configured so as to output a logic calculation of an input value specified by a plurality of addresses to a data line, and/or operate as a connection element when truth value table data is written in configured so as to output an input value specified by a certain address to a data line connected to an address of another memory cell unit, and wherein a memory cell unit to which the first truth value table data set is allotted is simulated with an execution in synchronization with a clock, and/or the plurality of the second truth value table data sets are simulated with an execution in non-synchronization with the clock, and whether the semiconductor device realizes a certain operation speed is evaluated.

2. The arrangement and wiring method according to claim 1, wherein the semiconductor device includes for each memory cell unit an address decoder which decodes an address input from N (N being an integer of 2 or more) number of address lines and outputs a word selection signal to a word line, the memory cell unit is connected to the word line and the data line, stores respective piece of data configuring the truth value table, and includes a plurality of storage elements which input and output the data to and from the data line by the word selection signal input from the word line, and the N number of address lines of the memory cell unit are respectively connected to the data line of N number of memory cell units other than the memory cell unit.

3. An arrangement and wiring apparatus which performs arrangement and wiring of a reconfigurable semiconductor device, characterized by comprising a processor, wherein the processor:

generates a net list based on a circuit description in which a circuit configuration is described;

extracts a sequential circuit data set which is to be scanned from the net list;

generates a first truth value table data set so as to write into a first set among plurality of memory cell units from the sequential circuit data set which is to be scanned; and generates a second truth value table data set so as to write into a second set among the plurality of memory cell units from a combination logic circuit data set of the net list; and wherein the reconfigurable semiconductor device includes the plurality of memory cell units configuring arrays, and the memory cell units operate as a logic element when truth value table data is written in configured so as to output a logic calculation of an input value specified by a plurality of addresses to a data line, and/or operate as a connection element when truth value table data is written in configured so as to output an input value specified by a certain address to a data line connected to an address of another memory cell unit, and wherein the processor is configured so as to simulate an execution in synchronization with a clock for a memory cell unit to which the first truth value table data set is allotted, and/or simulate an execution in non-synchronization with the clock for the plurality of the second truth value table data sets, and evaluate whether the semiconductor device realizes a certain operation speed.

4. A non-transitory storage medium which stores a program to arrange and wire a reconfigurable semiconductor device, characterized by making a processor execute processing of:

generating a net list based on a circuit description in which a circuit configuration is described;

extracting a sequential circuit data set which is to be scanned from the net list;

generating a first truth value table data set so as to write into a first set among plurality of memory cell units from the sequential circuit data set which is to be scanned; and generating a second truth value table data set so as to write into a second set among the plurality of memory cell units from a combination logic circuit data set of the net list; and wherein the reconfigurable semiconductor device includes the plurality of memory cell units configuring arrays, and the memory cell units operate as a logic element when truth value table data is written in configured so as to output a logic calculation of an input value specified by a plurality of addresses to a data line, and/or operate as a connection element when truth value table data is written in configured so as to output an input value specified by a certain address to a data line connected to an address of another memory cell unit, and wherein the program makes the processor execute processing of simulating an execution in synchronization with a clock for a memory cell unit to which the first truth value table data set is allotted, and/or simulating an execution in non-synchronization with the clock for the plurality of the second truth value table data sets, and evaluating whether the semiconductor device realizes a certain operation speed.

5. The non-transitory storage medium according to claim 4, wherein the semiconductor device includes for each memory cell unit an address decoder which decodes an address input from N (N being an integer of 2 or more) number of address lines and outputs a word selection signal to a word line, the memory cell unit is connected to the word line and the data line, stores respective piece of data configuring the truth value table, and includes a plurality of storage elements which input and output the data to and from the data line by the word selection signal input from the word line, and the N number of address lines of the memory cell unit are respectively connected to the data line of N number of memory cell units other than the memory cell unit.

* * * * *